United States Patent
Tanaka

(10) Patent No.: US 11,581,302 B2
(45) Date of Patent: Feb. 14, 2023

(54) INTERCONNECTED VERTICAL DIODE GROUP

(71) Applicant: SOCIONEXT INC., Kanagawa (JP)

(72) Inventor: Hidetoshi Tanaka, Kanagawa (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 16/999,933

(22) Filed: Aug. 21, 2020

(65) Prior Publication Data

US 2020/0381416 A1    Dec. 3, 2020

Related U.S. Application Data

(63) Continuation of application No. PCT/JP2018/006748, filed on Feb. 23, 2018.

(51) Int. Cl.
*H01L 27/02* (2006.01)
*H01L 29/06* (2006.01)

(52) U.S. Cl.
CPC ...... *H01L 27/0255* (2013.01); *H01L 29/0669* (2013.01)

(58) Field of Classification Search
CPC .............. H01L 27/0255; H01L 29/0669; H01L 21/822; H01L 27/04; H01L 29/0676; H01L 29/866; H01L 29/8613; H01L 29/6603; H01L 29/6606; H01L 29/66204
See application file for complete search history.

(56) References Cited

U.S. PATENT DOCUMENTS

| 4,596,070 A | 6/1986 | Bayraktaroglu |
| 5,512,776 A | 4/1996 | Bayraktaroglu |
| 9,177,924 B2 | 11/2015 | Colinge et al. |
| 9,559,095 B2 | 1/2017 | Chen et al. |
| 9,646,973 B2 | 5/2017 | Liaw |
| 9,653,585 B2 | 5/2017 | Zhang |

(Continued)

FOREIGN PATENT DOCUMENTS

| JP | S48-043077 B1 | 12/1973 |
| JP | S61-111574 A | 5/1986 |

(Continued)

OTHER PUBLICATIONS

Office Action issued in Japanese Patent Application 2020-501961, dated Oct. 19, 2021, with English translation.

(Continued)

*Primary Examiner* — Didarul A Mazumder
*Assistant Examiner* — Wasiul Haider
(74) *Attorney, Agent, or Firm* — McDermott Will & Emery LLP

(57) ABSTRACT

An ESD protection diode in a semiconductor device includes: a semiconductor substrate; a diode group that has a plurality of grouped VNW diodes, each of the VNW diodes having a VNW having a lower end and an upper end, that are formed on the semiconductor substrate and have a semiconductor material; and a top plate that is formed above the diode group and is a conductive layer electrically connected to the upper ends of the VNWs of the respective VNW diodes, and there is fabricated the semiconductor device that is capable of, even when large current flows through the VNW diode, suppressing current concentration and preventing damage of the VNW diode.

14 Claims, 38 Drawing Sheets

(56) References Cited

U.S. PATENT DOCUMENTS

| | | | |
|---|---|---|---|
| 2009/0200536 A1 | 8/2009 | Van Schaijk et al. | |
| 2010/0155702 A1 | 6/2010 | Wernersson | |
| 2013/0099190 A1* | 4/2013 | Oh | H01L 27/2463 |
| | | | 257/E45.001 |
| 2013/0207075 A1 | 8/2013 | Myers et al. | |
| 2016/0254318 A1* | 9/2016 | Lu | G11C 11/1659 |
| | | | 257/421 |
| 2017/0179027 A1* | 6/2017 | Kim | H01L 27/11286 |

FOREIGN PATENT DOCUMENTS

| | | |
|---|---|---|
| JP | 2008-505476 A | 2/2008 |
| JP | 2010-525557 A | 7/2010 |

OTHER PUBLICATIONS

International Search Report and Written Opinion issued in corresponding International Patent Application No. PCT/JP2018/006748, dated Apr. 24, 2018, with partial English translation.

Notice of Reasons of Refusal issued in the corresponding Japanese Patent Application No. 2020-501961, dated Feb. 8, 2022, with English translation.

* cited by examiner

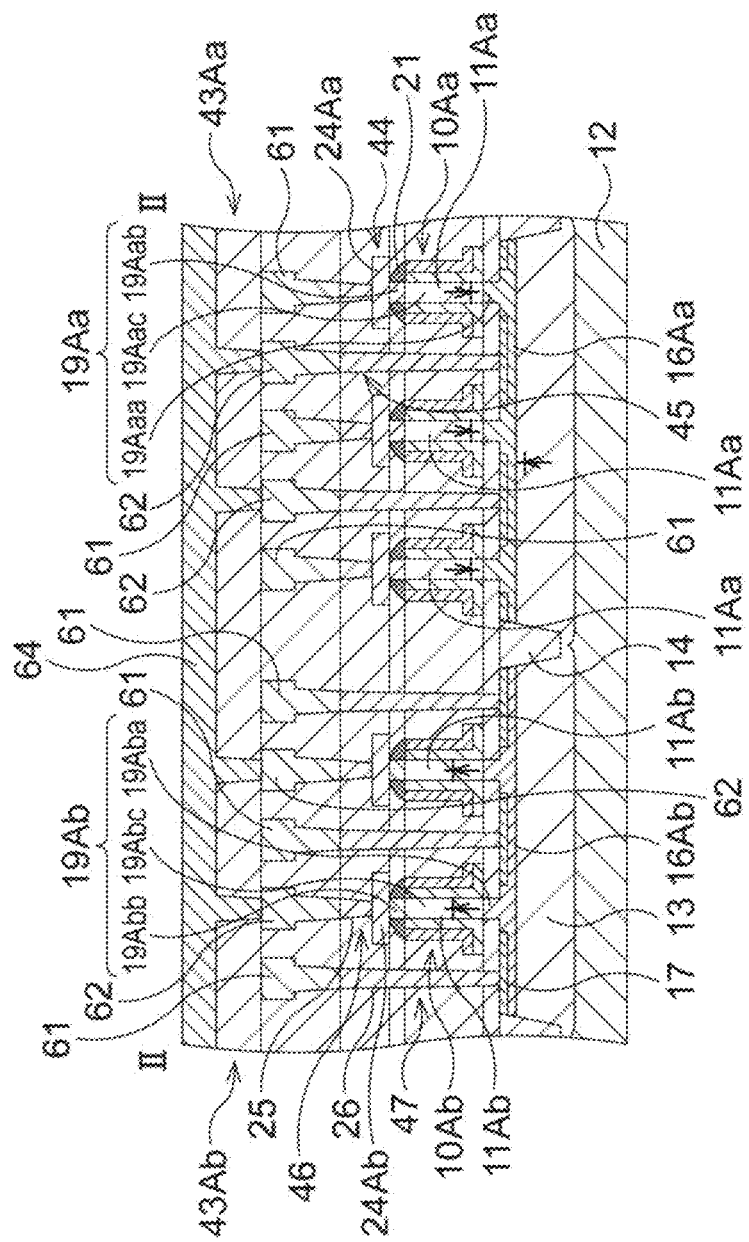

INTERCONNECTED VERTICAL DIODE GROUP

CROSS-REFERENCE TO RELATED APPLICATION

This application is a continuation application of International Application PCT/JP2018/006748 filed on Feb. 23, 2018 and designated the U.S., the entire contents of which are incorporated herein by reference.

FIELD

The embodiments discussed herein are directed to a semiconductor device.

BACKGROUND

When a semiconductor device is assembled into a semiconductor package or is handled, a large surge current is generated to cause electrostatic discharge damage (ESD) in transistors and the like in some cases. In order to prevent this ESD, a protection circuit with an ESD protection diode is sometimes added to a circuit configuration. The generated surge current flows through the ESD protection diode, which suppresses the flow through the transistors and the like, resulting in that the ESD of the transistors and the like is suppressed.

[Patent Document 1] U.S. Pat. No. 9,653,585
[Patent Document 2] U.S. Pat. No. 9,646,973
[Patent Document 3] U.S. Pat. No. 9,177,924

Recently, there have been devised diodes using projecting vertical nanowires (VNWs) that provided vertically on a semiconductor substrate and are made of semiconductor materials. The VNWs are fine and occupy a small area. Therefore, it is conceived that the VNWs are applied to the ESD protection diode to attempt a reduction in the occupied area of the ESD protection diode in the circuit configuration.

The ESD protection diode needs to take into account a large surge current flow. When the VNW is used as the ESD protection diode, there is a concern that the VNW is damaged by the surge current concentrating in the VNW. At present, a method to suppress the current concentration in the VNW, which is the ESD protection diode, has not been studied.

SUMMARY

One aspect of the semiconductor device includes: a semiconductor substrate; a plurality of first projections that are formed vertically to the semiconductor substrate on the semiconductor substrate and have a semiconductor material, each of a plurality of the first projections having a first lower end connected to the semiconductor substrate and a first upper end on the side opposite to the first lower end; a first diode group that has a plurality of diodes formed with a plurality of the first projections, each of a plurality of the diodes having a first conductivity type portion at the first lower end, and each of a plurality of the diodes having a second conductivity type portion that is different from the first conductivity type at the first upper end; and a first conductive layer that is formed above the first diode group and is electrically connected to upper ends of a plurality of the first projections in common.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 22B is a cross-sectional view illustrating a cross section taken along a solid line II-II in FIG. 21;

DESCRIPTION OF EMBODIMENTS

Hereinafter, there are explained in detail various embodiments of a semiconductor device provided with an ESD protection diode with reference to the drawings.

First Embodiment

Figure 1:
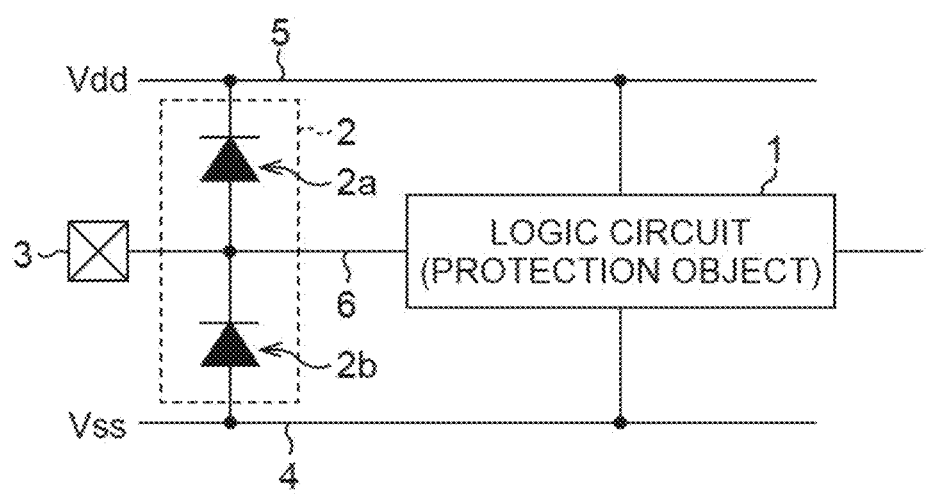
FIG. 1 is a circuit diagram illustrating a schematic configuration of a semiconductor device provided with an ESD protection diode according to a first embodiment.
Figure 2:
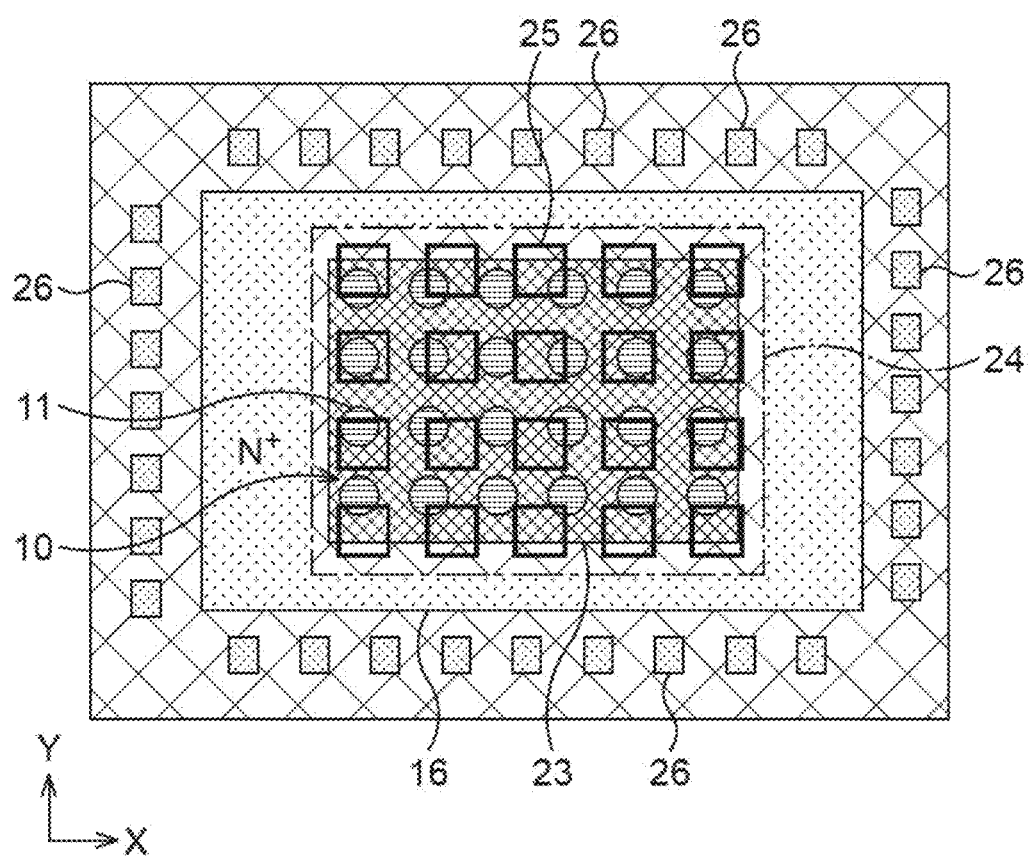
FIG. 2 is a plan view illustrating a schematic configuration of the ESD protection diode in the semiconductor device according to the first embodiment, from which wiring structures on contact plugs are removed.
Figure 3:
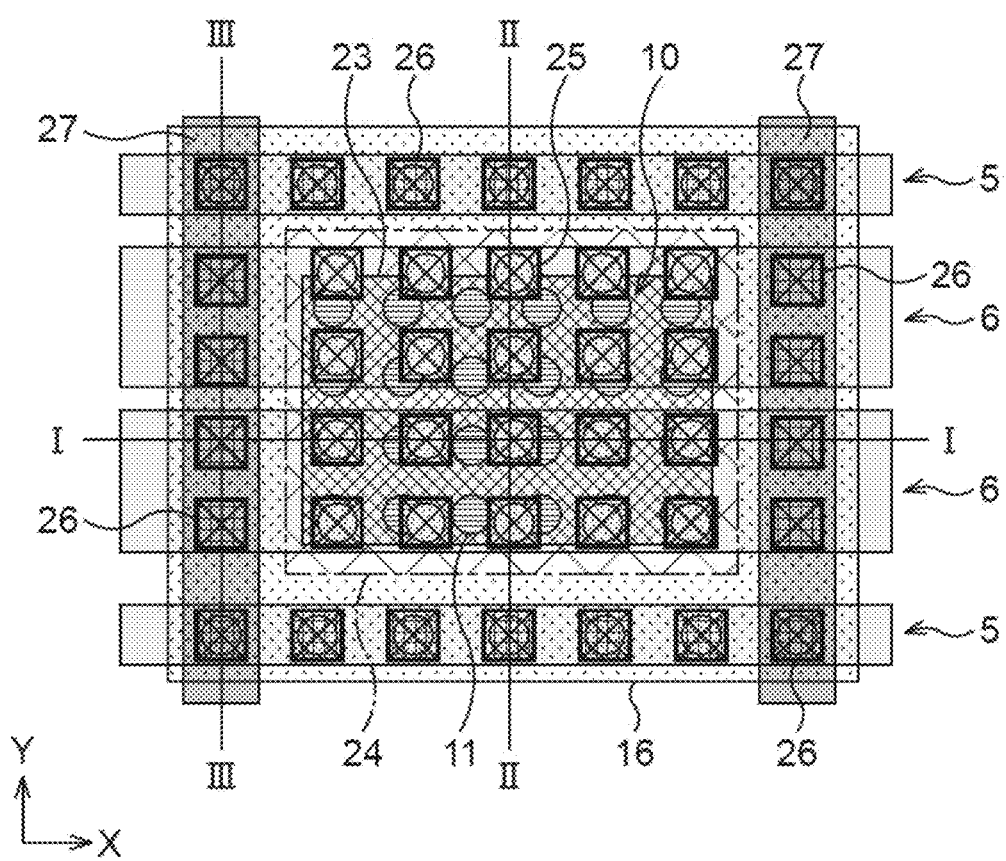
FIG. 3 is a plan view illustrating a schematic configuration of the ESD protection diode in the semiconductor device according to the first embodiment, which includes the wiring structures on the contact plugs.
Figure 4A:
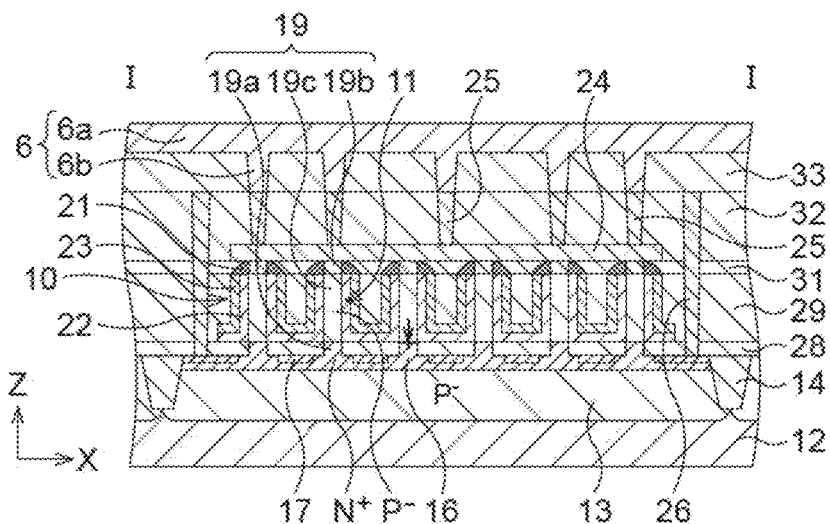
FIG. 4A is a cross-sectional view illustrating a cross section taken along a solid line I-I in FIG. 3.
Figure 4B:
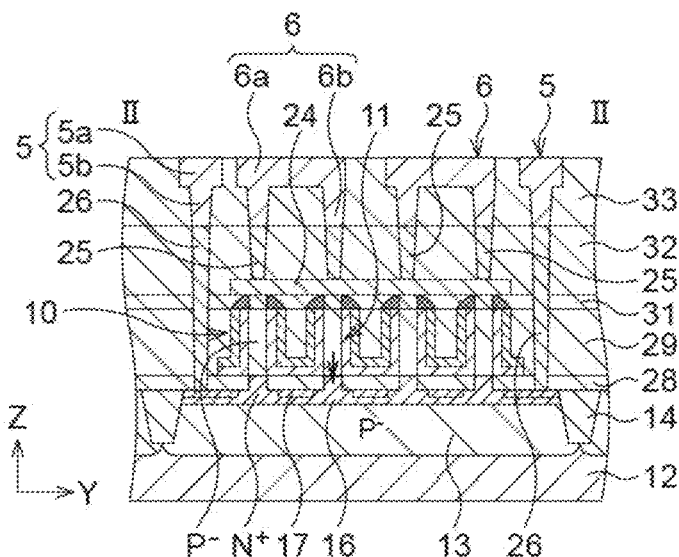
FIG. 4B is a cross-sectional view illustrating a cross section taken along a solid line II-II in FIG. 3.
Figure 4C:
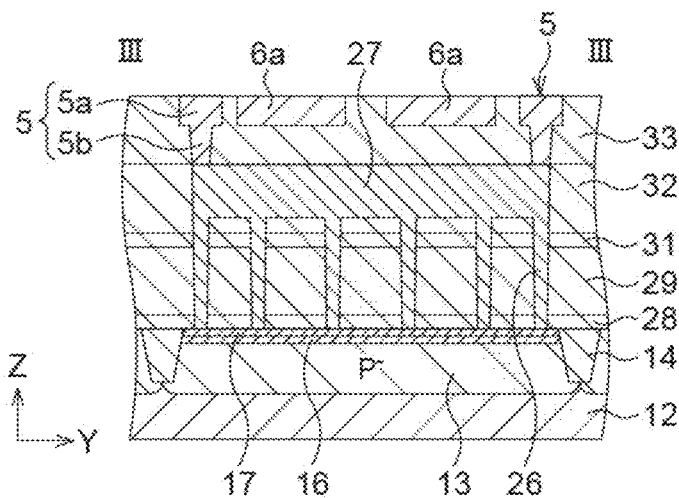
FIG. 4C is a cross-sectional view illustrating a cross section taken along a solid line III-III in FIG. 3.

Hereinafter, there is explained a first embodiment. FIG. 1 is an example of a circuit diagram illustrating a schematic configuration of a semiconductor device provided with an ESD protection diode according to this embodiment. FIG. 2 is a plan view illustrating a schematic configuration of the ESD protection diode in the semiconductor device according to this embodiment, from which wiring structures on contact plugs are removed. FIG. 3 is a plan view illustrating a schematic configuration of the ESD protection diode in the semiconductor device according to this embodiment, which includes the wiring structures on the contact plugs. FIG. 4A is a cross-sectional view illustrating a cross section taken along a solid line I-I in FIG. 3. FIG. 4B is a cross-sectional view illustrating a cross section taken along a solid line II-II in FIG. 3. FIG. 4C is a cross-sectional view illustrating a cross section taken along a solid line III-III in FIG. 3.

The semiconductor device according to this embodiment includes a logic circuit 1 and a protection circuit 2, as illustrated in FIG. 1. The logic circuit 1 is a semiconductor circuit being an object to be protected from surge currents, and includes functional elements such as transistors and resistor elements, for example. The protection circuit 2 includes a diode 2a connected between a node of a Pad wiring 6 electrically connected to a signal pad 3 and a node of a Vdd power line 5. Further, the protection circuit 2 includes a diode 2b connected between the node of the signal pad 3 and a node of a Vss power line 4. The diode 2a and the diode 2b each have a plurality of VNW diodes (a VNW diode group). When a surge current is input from the signal pad 3, the protection circuit 2 can suppress the damage of the logic circuit 1 caused by the surge current. Incidentally, in FIG. 1, the ESD protection circuit 2 includes the diode 2a and the diode 2b, but may have only one of them.

The configuration of the diode 2a is illustrated in FIG. 2 to FIG. 4C as an example. The diode 2a includes a VNW diode group 10 including a plurality of VNW diodes 11 grouped and arranged, for example, in a matrix in a plane view. The VNW diode group 10 including a plurality of the VNW diodes 11 arranged in a matrix has sides extending in the X direction and sides extending in the Y direction, for example. Incidentally, as for the diode 2b, a "pad wiring" may be used in place of a "Vdd power line" to be explained below as a component member of the VNW diode group, and a "Vss power line" may be used in place of the "pad wiring". Further, in the VNW diode group 10, a plurality of the VNW diodes 11 may be arranged in a form other than the matrix in a plane view.

As illustrated in FIG. 4A and FIG. 4B, a P well 13 having a P-type conductivity type, for example, is formed in a region of a semiconductor substrate 12 defined by STI element isolation regions 14. On the top of the P well 13, a bottom region 16 having an N-type conductivity type is formed. A silicide layer 17 is formed on the surface of the semiconductor substrate 12, which is the top of the bottom region 16. On the semiconductor substrate 12, a plurality of projecting semiconductor nanowires 19 are formed vertically to the surface of the semiconductor substrate 12. As illustrated in FIG. 2 and FIG. 3, a plurality of the semiconductor nanowires 19 are arranged in a matrix in a plane view. The VNW diode 11 is formed with each of a plurality of the semiconductor nanowires 19 each having a lower end portion 19a, an upper end portion 19b, and a middle portion 19c between the lower end portion 19a and the upper end portion 19b. The lower end portion 19a has an N-type conductivity type and is electrically connected to the bottom region 16. The upper end portion 19b has a P-type conductivity type. The middle portion 19c has a P-type conductivity type and forms a PN junction with the lower end portion 19a. An insulating film sidewall 21 is formed on side surfaces of the upper end portion 19b. The lower end portions 19a of a plurality of the semiconductor nanowires 19 are electrically connected to each other by the bottom region 16. Incidentally, the concentration of a P-type impurity of the middle portion 19c may be lower than or equal to that of the upper end portion 19b. Further, the middle portion 19c may have an N-type conductivity type in place of the P type to form a PN junction with the upper end portion 19b. Further, when the semiconductor substrate 12 is a P-type substrate, the formation of the P well 13 may be omitted.

On side surfaces of the semiconductor nanowire 19, a gate electrode 23 is formed via a gate insulating film 22. The gate electrodes 23 of a plurality of the semiconductor nanowires 19 may be formed separately from each other, or may be formed in whole or in part as a single-layer conductive film. Incidentally, the gate insulating film 22 and the gate electrode 23 are formed simultaneously with a gate insulating film and a gate electrode of transistors of the logic circuit 1 as described later, and the formations of them may be omitted for the VNW diode 11.

A top plate 24 being a conductive film of silicide, metal, or the like, is formed on a plurality of the semiconductor nanowires 19. The upper end portions 19b of the semiconductor nanowires 19 of the respective VNW diodes 11 are electrically connected to each other via the top plate 24. The overall top plate 24, as a single conductive film, for example, conducts with the respective VNW diodes 11.

A plurality of contact plugs 25 are arranged in a matrix in a plane view on the top plate 24, and the respective contact plugs 25 are electrically connected to the top plate 24. The respective contact plugs 25 are arranged to be displaced from the respective semiconductor nanowires 19 positioned therebelow in a plane view. Incidentally, the respective contact plugs 25 are sometimes arranged overlapping the respective semiconductor nanowires 19 positioned therebelow in a plane view. Incidentally, being arranged overlapping includes the cases where their arrangement is varied due to manufacturing variations, positional displacement, and the like. This is also true for other embodiments and various modified examples.

As above, of a plurality of the VNW diodes 11, the upper end portions 19b are connected to each other and the lower end portions 19a are connected to each other, and thereby the surge current is distributed to the respective VNW diodes 11. Therefore, the surge current flowing through each of the VNW diodes 11 decreases, thereby making it possible to suppress the damage of the VNW diode 11 due to current concentration. Further, when a plurality of the contact plugs 25 are arranged, the surge current is distributed to the respective contact plugs 25. Therefore, it is possible to increase a distribution effect of the surge current flowing through the VNW diodes 11 positioned below the contact plugs 25.

Around the VNW diode group 10, a plurality of contact plugs 26 are arranged in a row along each side of the VNW diode group 10 in a plane view. The contact plugs 26 are in contact with the silicide layer 17 and are electrically connected to the lower end portions 19a via the silicide layer 17 and the bottom region 16. As illustrated in FIG. 4C, as for the two sides in the Y direction (the longitudinal direction) in FIG. 3 out of the four sides of the contact plugs 26, local interconnects 27 are each formed on a plurality of the contact plugs 26 aligned on each side of these two sides. A plurality of the contact plugs 26 aligned on each of these two sides may be formed in an integrated manner with the local interconnect 27.

On the contact plugs 25, 26 and the local interconnects 27, the Vdd power lines 5 and the pad wirings 6 electrically connected to the signal pad 3 are formed. The Vdd power line 5 and the pad wiring 6 may be arranged in a straight line (a band shape), for example, parallel to each other (parallel to the X direction in FIG. 3, for example) in a plane view. Incidentally, the Vdd power line 5 and the pad wiring 6 are not arranged in a straight line parallel to each other, but may be arranged in such a way that, for example, they are bent or intersect in part via an insulating film. Further, in the example in FIG. 3, two Vdd power line 5 and two pad wirings 6 are arranged in a plane view, but the number of Vdd power lines 5 and the number of pad wirings 6 each may be one or three or more.

The Vdd power lines 5 are electrically connected to the respective contact plugs 26. The Vdd power line 5 has a dual damascene structure with a wiring portion 5a and a via portion 5b formed integrally. The via portion 5b is in contact with the top surfaces of the contact plugs 26 or with the local interconnects 27. The pad wirings 6 are electrically connected to the respective contact plugs 25. The pad wiring 6 has a dual damascene structure with a wiring portion 6a and a via portion 6b formed integrally. The via portion 6b is in contact with the contact plugs 25. Incidentally, the wiring portion 5a and the via portion 5b may be formed separately to have a single damascene structure. In this case, the wiring portion 5a and the via portion 5b may be formed of materials different from each other. Further, the wiring portion 6a and the via portion 6b each may be formed to have a single damascene structure similarly and may be formed of different materials. These are not limited to this embodiment, and the wirings may be formed to have a single damascene structure also in other embodiments and modified examples.

The VNW diodes 11 and part of the contact plugs 26 are formed in an insulating film 28 and interlayer insulating films 29, 31. The top plate 24, the contact plugs 25, another part of the contact plugs 26, and the local interconnects 27 are formed in an interlayer insulating film 32. The Vdd power lines 5 and the pad wirings 6 are formed in an interlayer insulating film 33.

As described above, according to this embodiment, a plurality of the VNW diodes are electrically connected via the top plate in the ESD protection diode. As a result, even when large current flows through the VNW diode, the current concentration can be suppressed to suppress the damage of the VNW diode. Incidentally, in this embodiment, the conductivity type of the bottom region 16 and the lower end portion 19a is set to the N type and the conductivity type of the upper end portion 19b is set to the P type, but they each may be set to the opposite conductivity type. In this case, the pad wiring 6 is electrically connected to the upper end portions 19b and the Vdd power line 5 is electrically connected to the lower end portions 19a. Further, the ESD protection diode in this embodiment may be applied to the diode 2a. In this case, out of the lower end portion 19a and the upper end portion 19b, the pad wiring 6 is electrically connected to the N-type conductivity type and the Vss power line 4 is electrically connected to the P-type conductivity type. For example, when the conductivity type of the upper end portion 19b is the P type and the conductivity type of the lower end portion 19a is the N type, the Vas power line 4 is arranged in place of the pad wiring 6 in FIG. 3 and FIGS. 4A, 4B, and 4C, and the pad wiring 6 is arranged in place of the Vdd power line 5. As above, not only in this embodiment, but also in other embodiments and various modified examples, the conductivity type of a portion of each of the diodes and the type of wiring connected electrically can be changed similarly. Further, the formation of the top plate 24 may be omitted, or a local interconnect that is electrically connected to the upper end portions 19b of a plurality of the VNW diodes 11 in common may be formed on the top plate 24. Further, the VNW diode in the first embodiment has been explained as an ESD protection diode, but it is not limited to this, and may be applied to diodes for other uses. Further, the same applies not only to this embodiment but also to other embodiments and various modified examples.

MODIFIED EXAMPLE

Hereinafter, there are explained various modified examples of the semiconductor device in the first embodiment.

Modified Example 1

Figure 5:
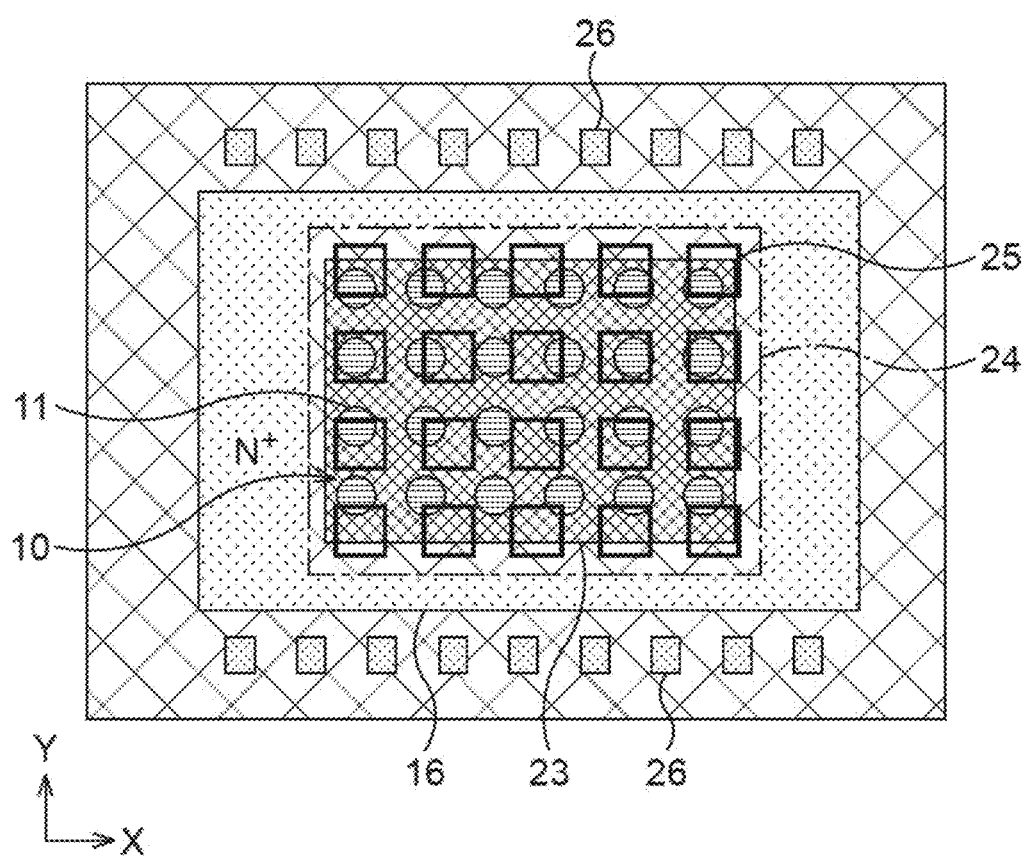
FIG. 5 is a plan view illustrating a schematic configuration of an ESD protection diode in a semiconductor device according to a modified example 1 of the first embodiment, from which wiring structures on contact plugs are removed.
Figure 6:
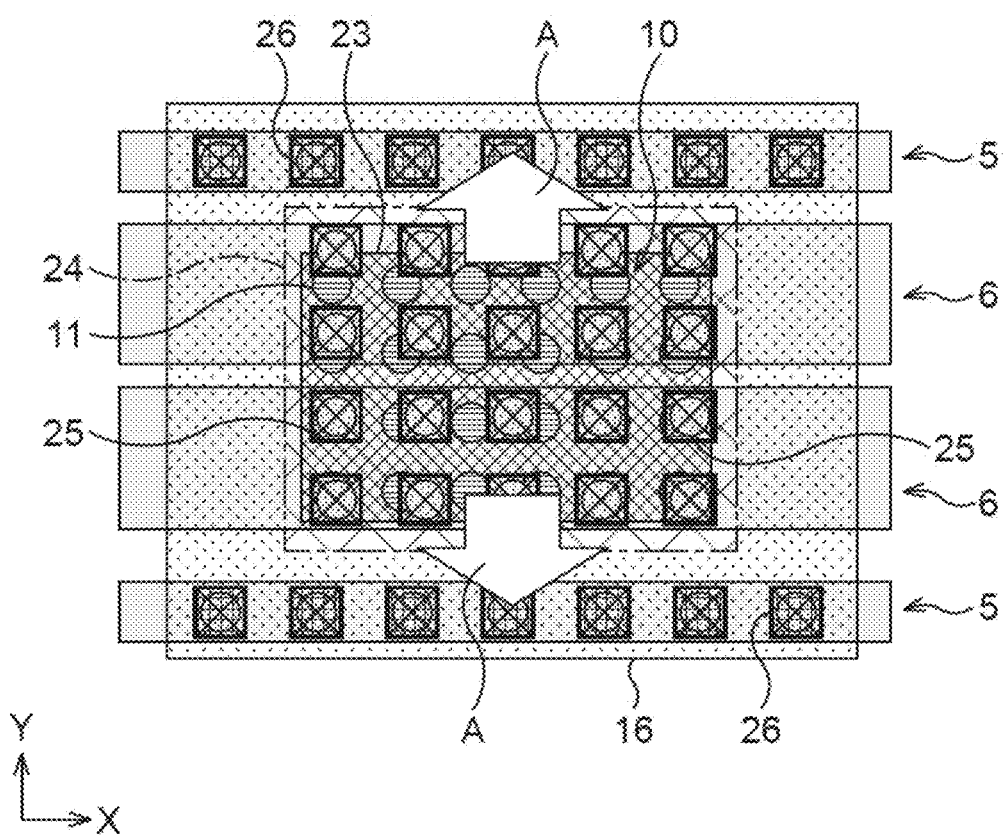
FIG. 6 is a plan view illustrating a schematic configuration of the ESD protection diode in the semiconductor device according to the modified example 1 of the first embodiment, which includes the wiring structures on the contact plugs.

FIG. 5 is a plan view illustrating a schematic configuration of an ESD protection diode in a semiconductor device according to a modified example 1 of the first embodiment, from which wiring structures on contact plugs are removed. FIG. 6 is a plan view illustrating a schematic configuration of the ESD protection diode in the semiconductor device according to the modified example 1 of the first embodiment, which includes the wiring structures on the contact plugs. Incidentally, the same components as those illustrated in FIG. 2 to FIG. 4C in the first embodiment are denoted by the same reference numerals and symbols and their detailed explanations are omitted.

In this example, a plurality of the contact plugs 26 electrically connected to the Vdd power line 5 are provided in a row along, out of the four sides around the VNW diode group 10, only the sides where a larger number of the VNW diodes 11 are aligned. Here, a plurality of the contact plugs 26 are provided in a row on the two sides in the X direction (the lateral direction) in FIG. 5. In FIG. 5, in the VNW diode group 10, six VNW diodes 11 are illustrated as an example in the X direction and four VNW diodes 11 are illustrated as an example in the Y direction (the longitudinal direction).

In this example, a plurality of the contact plugs 26 are provided in a row only on, out of the four sides around the VNW diode group 10, the two sides extending in the X direction where a larger number of the VNW diodes 11 are aligned. In this case, as illustrated in FIG. 6, there are current paths in the Y direction indicated by an arrow A. Incidentally, if the contact plugs 26 are arranged on the four sides around the VNW diode group 10 so as to surround the VNW diode group 10, in addition to the current paths in the Y direction, there are also current paths in the X direction. As a result, the surge current concentrates in the VNW diodes 11 at the four corners of the VNW diode group 10, and the VNW diodes 11 at the four corners are easily damaged. Therefore, in this example, by arranging the contact plugs 26 only on the two sides extending in the X direction, the concentration of surge current in the VNW diodes 11 at the four corners is reduced and the damage is suppressed.

Modified Example 2

Figure 7:
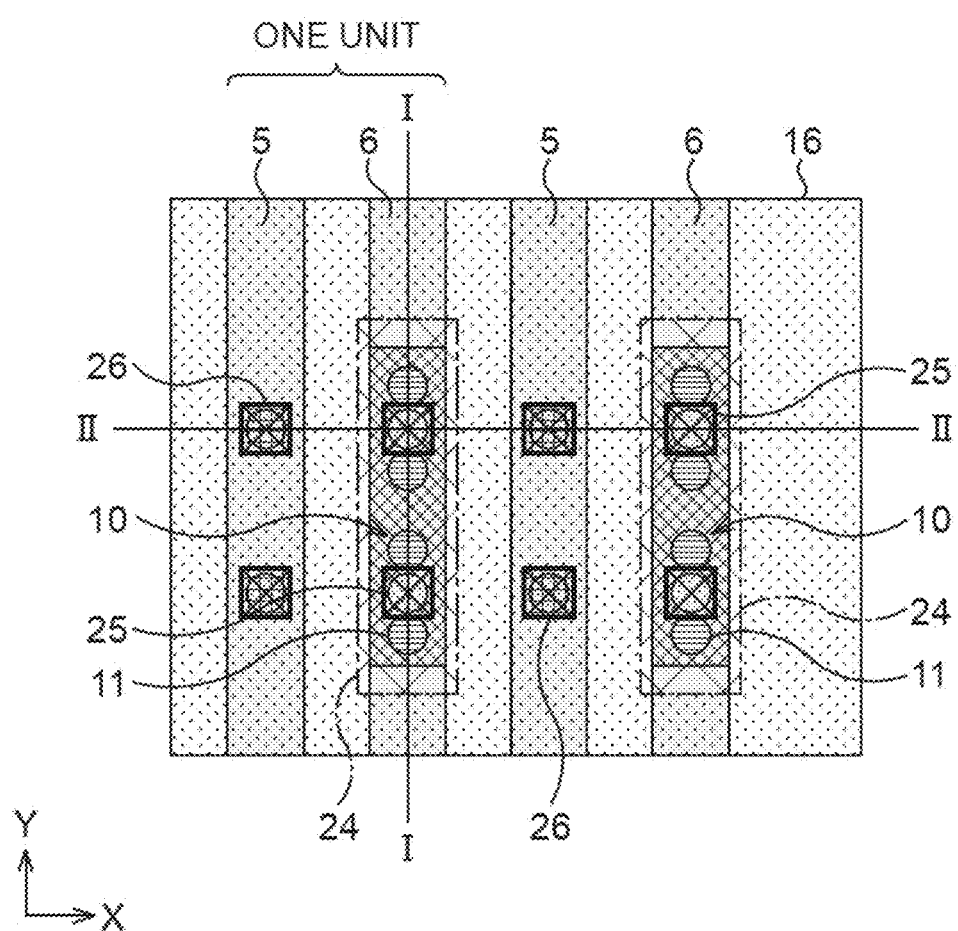
FIG. 7 is a plan view illustrating a schematic configuration of an ESD protection diode in a semiconductor device according to a modified example 2 of the first embodiment, which includes wiring structures on contact plugs.
Figure 8A:
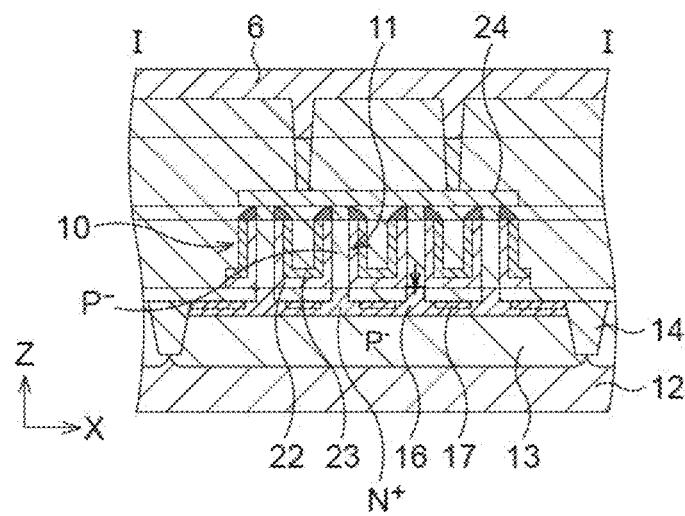
FIG. 8A is a cross-sectional view illustrating a cross section taken along a solid line I-I in FIG. 7.
Figure 8B:
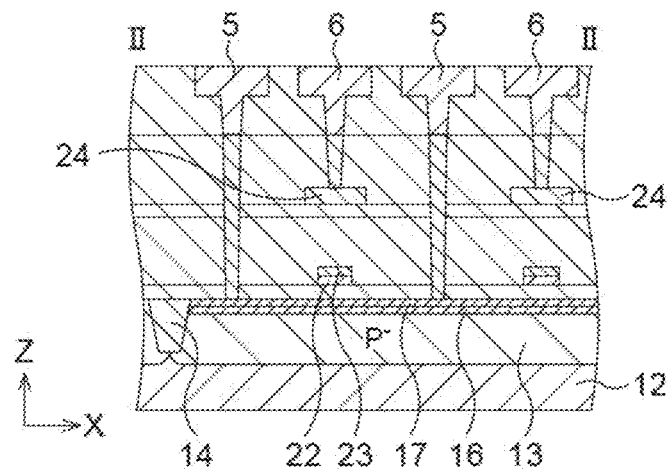
FIG. 8B is a cross-sectional view illustrating a cross section taken along a solid line II-II in FIG. 7.

FIG. 7 is a plan view illustrating a schematic configuration of an ESD protection diode in a semiconductor device according to a modified example 2 of the first embodiment, which includes wiring structures on contact plugs. FIG. 8A is a cross-sectional view illustrating a cross section taken along a solid line I-I in FIG. 7. FIG. 8B is a cross-sectional view illustrating a cross section taken along a solid line II-II in FIG. 7. Incidentally, the same components as those illustrated in FIG. 2 to FIG. 4C in the first embodiment are denoted by the same reference numerals and symbols and their detailed explanations are omitted.

In this example, the VNW diode group 10 consists of a plurality of the VNW diodes 11 arranged in a row in the Y direction (the longitudinal direction). In the illustrated example, the VNW diode group 10 consists of 1×4 VNW diodes 11. The top plate 24 is formed on the VNW diode group 10. The top plate 24 is electrically connected to the upper end portions 19b of the semiconductor nanowires 19 of the respective VNW diodes 11, and the overall top plate 24, as a single conductive film, conducts with the respective VNW diodes 11. Incidentally, the number of VNW diodes 11 arranged in the Y direction is not limited to four, and may be, for example, two or three, or a number larger than four.

A plurality of the contact plugs 25 are electrically connected on the top plate 24. The distance in a plane view between an arbitrary VNW diode 11 and the contact plug 25 closest to this VNW diode 11 is equal for each of the VNW diodes 11. In this example, a plurality (two in the illustrated example) of the contact plugs 25 each are arranged at a location between the two adjacent VNW diodes 11 in a plane view, and the distances between the contact plug 25 and these two adjacent VNW diodes 11 are equal in a plane view. By arranging the contact plugs 25 in this manner, the distances between each of the VNW diodes 11 and the contact plug 25 closest to this VNW diode 11 become equal, thereby making it possible to suppress the damage of the VNW diode 11 caused by the concentration of current in a specific VNW diode 11. Incidentally, the fact that the distance is equal includes the cases where the distance between the VNW diode 11 and the contact plug 25 varies due to manufacturing variations, and the like, for example.

Figure 9:
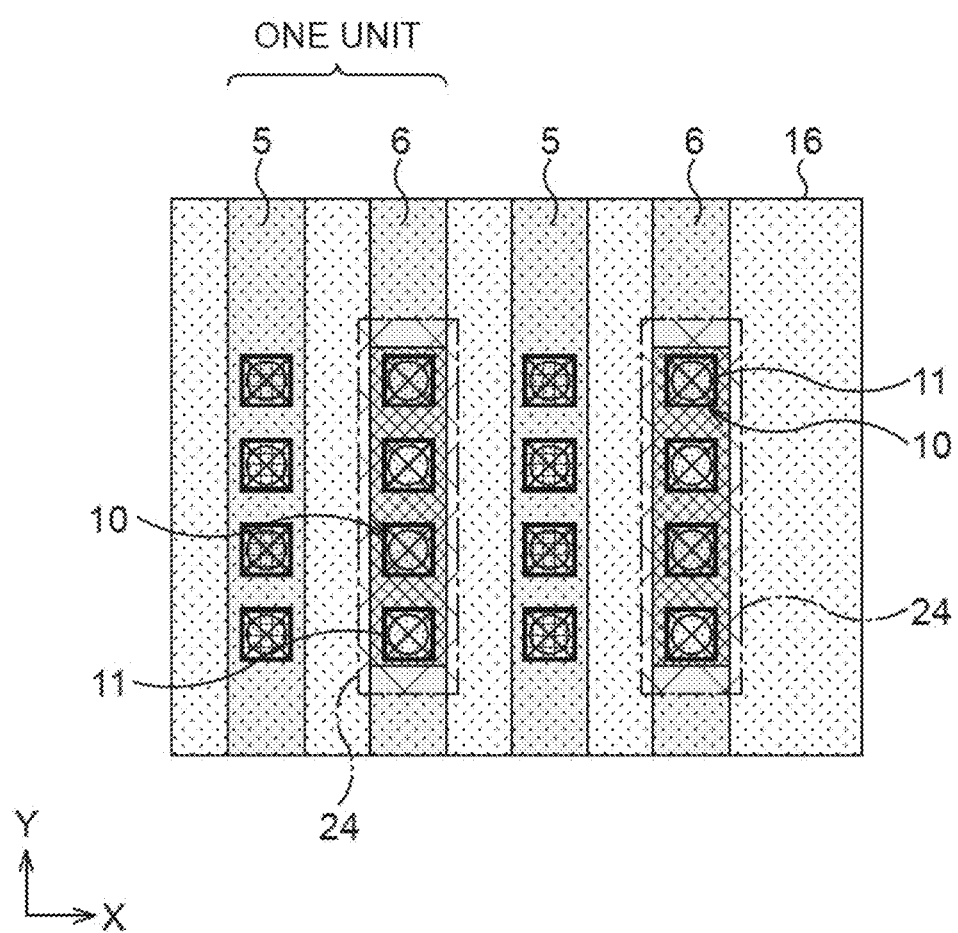
FIG. 9 is a plan view illustrating a schematic configuration of another example of the ESD protection diode in the semiconductor device according to the modified example 2 of the first embodiment.

Incidentally, the arrangement may be suitably changed according to the number of VNW diodes 11 and the number of contact plugs 25, and for example, the distances each between the VNW diode 11 and the contact plug 25 closest to this VNW diode 11 do not have to be equal. As illustrated in FIG. 9, the contact plugs 25 may be arranged so as to overlap the VNW diodes 11 positioned therebelow in a plane view.

Figure 10:
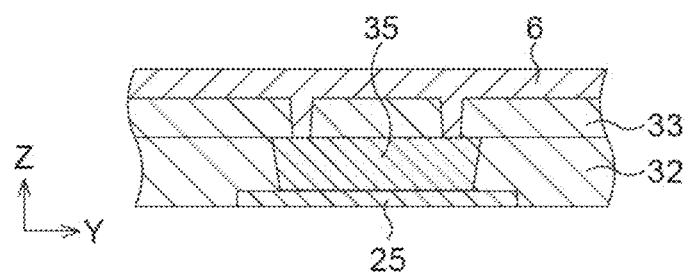
FIG. 10 is a plan view illustrating a schematic configuration of another example of the ESD protection diode in the semiconductor device according to the modified example 2 of the first embodiment.

As illustrated in FIG. 10, for example, in place of a plurality of the contact plugs 25, a local wiring 35 may be formed. In FIG. 10, only the portions on the top plate 24 are illustrated for convenience of illustration.

A plurality (two in the illustrated example) of the contact plugs 26 are arranged in a row along a row of the contact plugs 25. The pad wiring 6 is electrically connected to the contact plugs 25 arranged in a row, and the Vdd power line 5 is electrically connected to the contact plugs 26 arranged in a row. In this example, the pad wiring 6 (electrically connected to the single top plate 24) and the Vdd power line 5, which are adjacent to each other, are set as one unit, and such one unit is repeatedly arranged in parallel with each other. In FIG. 7, and the like, the case where the number of repetitions of such one unit is two is illustrated as an example, but the number of repetitions may be set to three or more. Further, the case where only one such a unit is arranged and is not repeated is also applicable.

Figure 11:
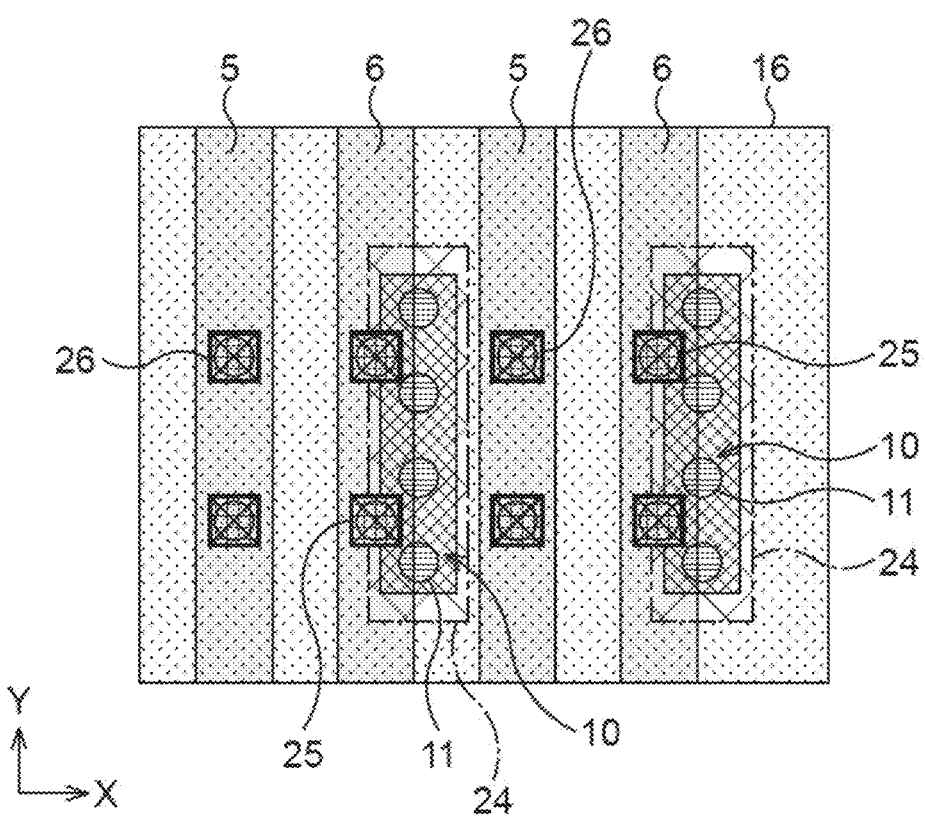
FIG. 11 is a plan view illustrating a schematic configuration of another example of the ESD protection diode in the semiconductor device according to the modified example 2 of the first embodiment.

Incidentally, as illustrated in FIG. 11, for example, the contact plugs 25 may be arranged so as to be displaced from the VNW diodes 11 in the X direction (the lateral direction) in a plane view. In this case as well, the distance between an arbitrary VNW diode 11 and the contact plug 25 closest to this VNW diode 11 in a plane view is equal for each of the VNW diodes 11 desirably.

Figure 12:
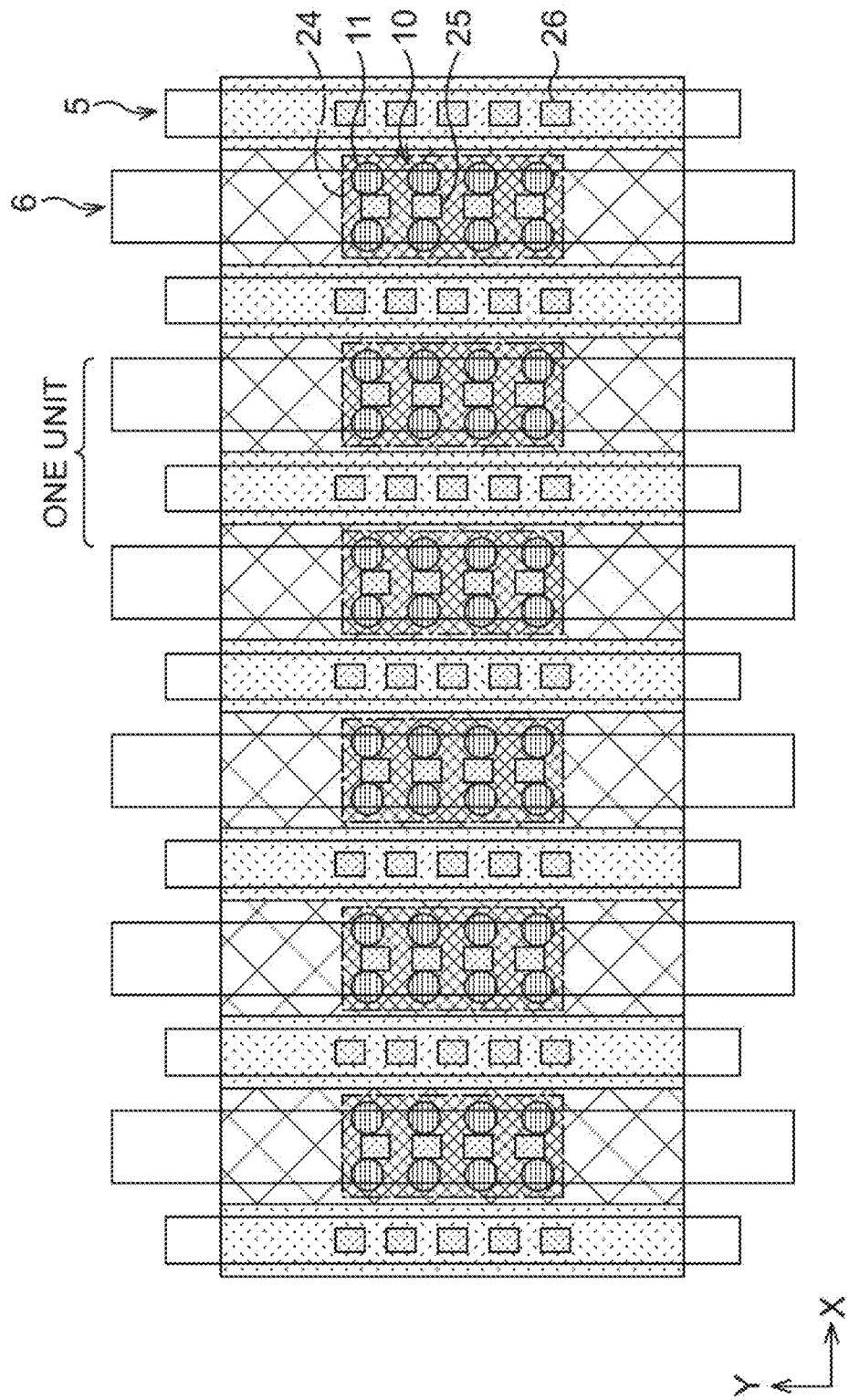
FIG. 12 is a plan view illustrating a schematic configuration of another example of the ESD protection diode in the semiconductor device according to the modified example 2 of the first embodiment.

Further, as illustrated in FIG. 12, for example, the VNW diode group 10 may be arranged to include two VNW diodes 11 aligned in the X direction (the lateral direction) and a plurality of VNW diodes 11 aligned in the Y direction. In the illustrated example, the VNW diode group 10 consists of 2×4 VNW diodes 11. Furthermore, three or more rows of a plurality of the VNW diodes 11 may be arranged to form the VNW diode group 10. By arranging a plurality of rows of the VNW diodes 11 to form the VNW diode group 10, the surge current flowing through the respective VNW diodes 11 is reduced, and the damage of the VNW diode 11 is suppressed. However, considering the ease of surge current flow, the number of VNW diodes 11 arranged in the Y direction (the longitudinal direction) is desirably larger than that in the X direction (the lateral direction), and five or more of the VNW diodes 11 may be arranged in the Y direction, for example.

Figure 13A:
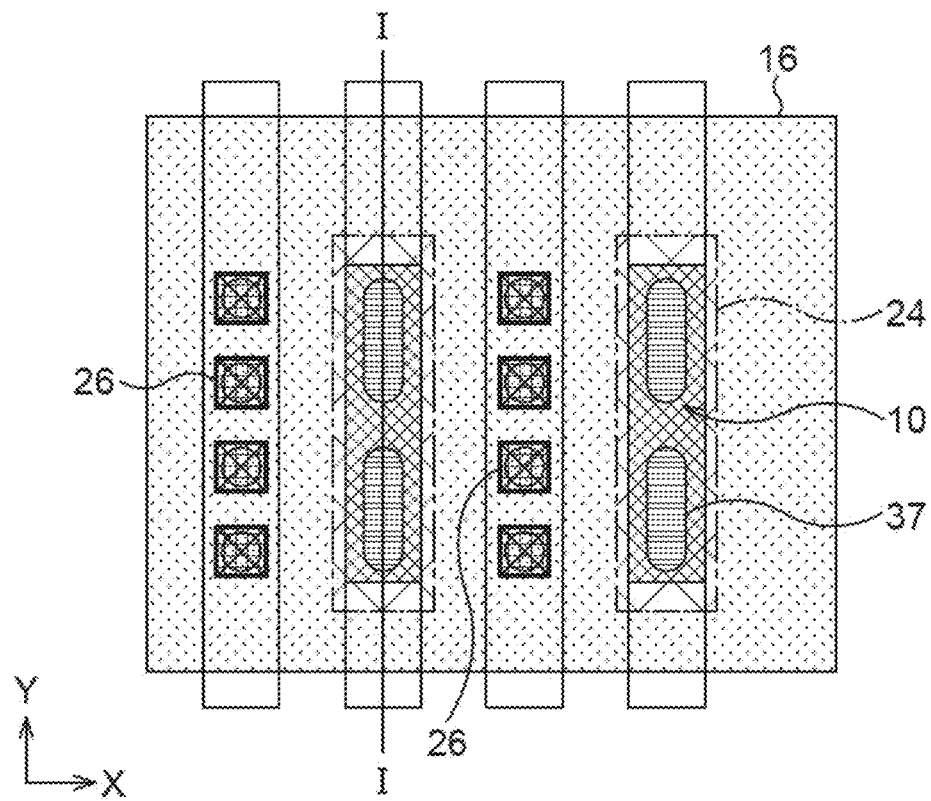
FIG. 13A is a plan view illustrating a schematic configuration of another example of the ESD protection diode in the semiconductor device according to the modified example 2 of the first embodiment.
Figure 13B:
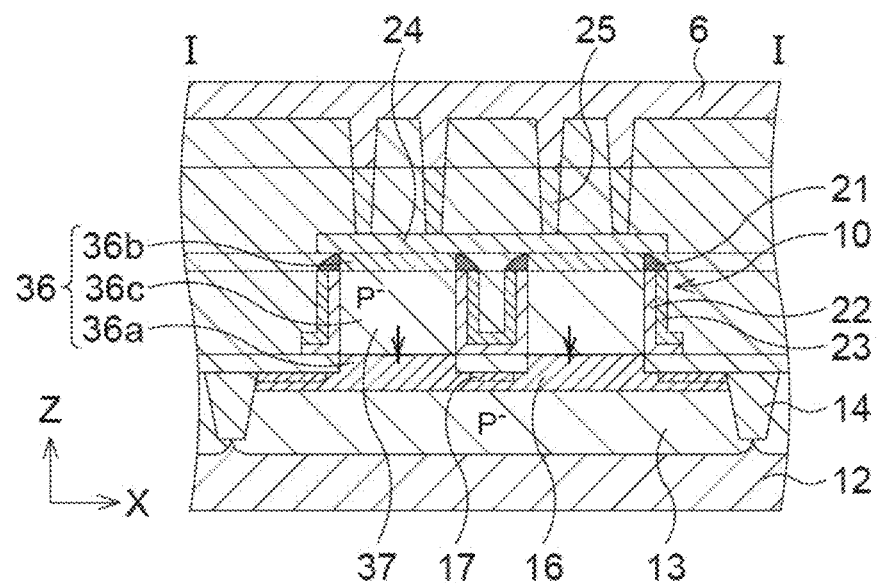
FIG. 13B is a cross-sectional view illustrating a cross section taken along a solid line I-I in FIG. 13A.

There are explained another example of the semiconductor nanowire. FIG. 13A is a plan view illustrating a schematic configuration of the ESD protection diode in the semiconductor device according to the modified example 2 of the first embodiment, which includes the wiring structures on the contact plugs. FIG. 13B is a cross-sectional view illustrating a cross section taken along a solid line I-I in FIG. 13A. In FIG. 13A, the illustration of the contact plugs 25 is omitted.

In place of the VNW diode 11 having the projecting semiconductor nanowire 19, a VNW (Vertical Nano Wall) diode 37 may be formed on the semiconductor substrate 12. In the illustrated example, the VNW diodes 37 are each arranged with its longitudinal direction set to the Y direction (the longitudinal direction). The VNW diodes 37 are vertically provided on the semiconductor substrate 12, and each Include a plate-shaped semiconductor nanowall 36 having a lower end portion 36a and an upper end portion 36b. The lower end portion 36a has an N-type impurity and is formed integrally with the bottom region 16, and the upper end portion 36b has a P-type impurity. The impurity of a middle portion 36c between the lower end portion 36a and the upper end portion 36b of the semiconductor nanowall 36 is a P type and has an impurity concentration lower than that of the upper end portion 36b. On side surfaces of the upper end portion 36b, the insulating film sidewall 21 is formed. A plurality of the semiconductor nanowalls 36 are electrically connected by the bottom region 16 at the lower end portions 36a. Incidentally, the VNW diode 37 is explained as one aspect of the modified example 2 of the first embodiment, but is applicable also to the first embodiment and the modified example 1 and later-described second to fifth embodiments and various modified examples in place of the VNW diode 11. Further, in the respective embodiments and the various modified examples, the VNW diode 11 and the VNW diode 37 may be used in combination. Incidentally, in FIG. 13A, two semiconductor nanowalls 36 are arranged in a row in the Y direction, but the number of semiconductor nanowalls 36 arranged may be one or three or more.

Modified Example 3

Figure 14:
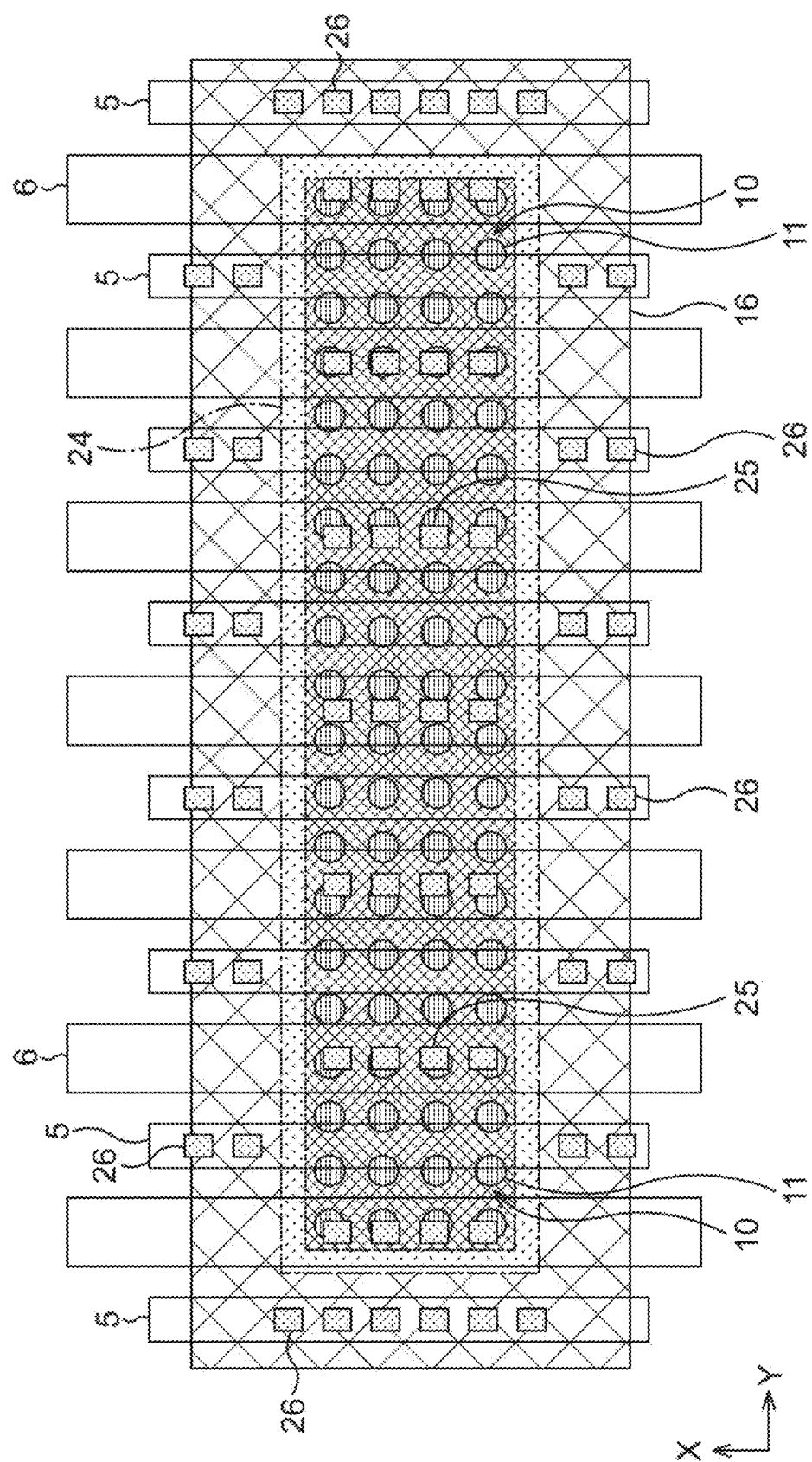
FIG. 14 is a plan view illustrating a schematic configuration of an ESD protection diode in a semiconductor device according to a modified example 3 of the first embodiment, which includes wiring structures on contact plugs.

FIG. 14 is a plan view illustrating a schematic configuration of an ESD protection diode in a semiconductor device according to a modified example 3 of the first embodiment, which includes wiring structures on contact plugs. Incidentally, the same components as those illustrated in FIG. 2 to FIG. 4C in the first embodiment are denoted by the same reference numerals and symbols and their detailed explanations are omitted.

In this example, the VNW diode group 10 includes a plurality of the VNW diodes 11 arranged in a matrix in the X direction and the Y direction. The top plate 24 is formed on the VNW diode group 10. The top plate 24 is electrically connected to the upper end portions 19b of the semiconductor nanowires 19 of the respective VNW diodes 11.

On the top plate 24, a row of a plurality (four in the illustrated example) of the contact plugs 25 arranged in the X direction is arranged repeatedly at predetermined intervals to be electrically connected. Each between the adjacent rows of the contact plugs 25, a row of the contact plugs 26 is provided in parallel with these rows. However, the contact plugs 26 forming such a row are arranged outside the top plate 24 in a plane view. The rows of the contact plugs 26 are provided also on both sides of the top plate 24.

The pad wirings 6 are each electrically connected to the contact plugs 25 arranged in a row on the top plate 24. The Vdd power lines 5 are each electrically connected to the contact plugs 26 arranged in a row, and are arranged in a plane view across above the top plate 24. In this example, the pad wiring 6 and the Vdd power line 5 that are adjacent to each other are set as one unit and such one unit is repeatedly arranged in parallel with each other. However, in FIG. 14, there is illustrated as an example the case where the Vdd power lines 5 connected to the rows of the contact plugs 26 provided on both sides of the top plate 24 are each arranged at both ends and the pad wiring 6 is positioned adjacently to each of the Vdd power lines 5 at the both ends. The local interconnect connected to the contact plugs 25, 26 may be arranged on four sides so as to surround the VNW diode group 10.

Second Embodiment

Figure 15:
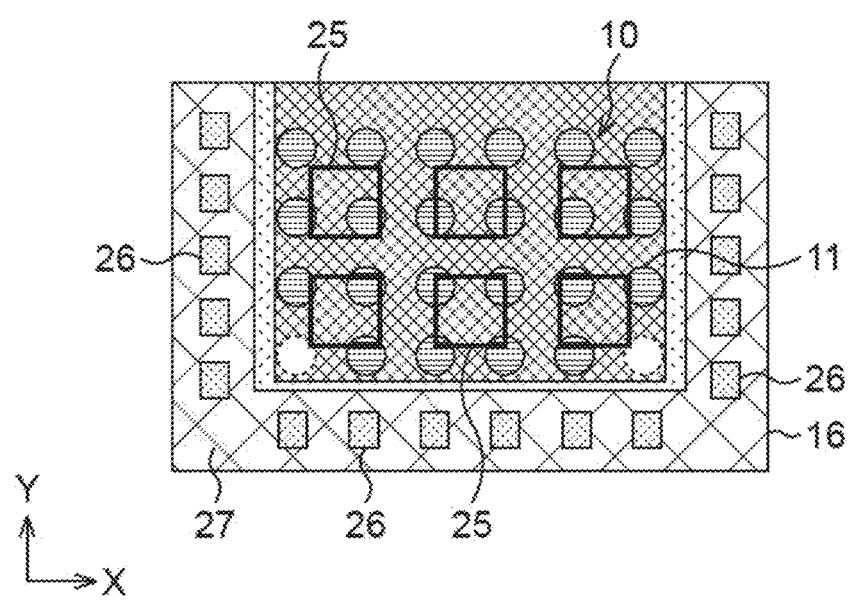
FIG. 15 is a plan view illustrating a schematic configuration of an ESD protection diode in a semiconductor device according to a second embodiment, from which wiring structures on contact plugs are removed.

Next, there is explained a second embodiment. FIG. 15 is a plan view illustrating a schematic configuration of an ESD protection diode in a semiconductor device according to the second embodiment, from which wiring structures on contact plugs are removed. Incidentally, the same components as those illustrated in FIG. 2 to FIG. 4C in the first embodiment are denoted by the same reference numerals and symbols and their detailed explanations are omitted.

In this embodiment, the VNW diode group 10 includes a plurality of the VNW diodes 11 arranged In a matrix in the X direction and the Y direction. A plurality of the contact plugs 26 electrically connected to the Vdd power line 5 are arranged in a row along the sides around the VNW diode group 10. Incidentally, in FIG. 15, out of the sides around the VNW diode group 10, the illustration of the upper side is omitted. Here, in the VNW diode group 10, among the VNW diodes 11 arranged in a matrix, the VNW diodes 11 (illustrated by a solid line circle in FIG. 15) at the corners each close to an intersecting portion of, out of the sides of the contact plugs 26, not-facing two sides are missing.

When the VNW diode 11 is present at the above corner, there is a path for the surge current to flow from the VNW diode 11 at this corner to the two contact plugs 26 positioned at ends of the not-facing two rows. Therefore, the surge current tends to concentrate in the VNW diode 11 at this corner, and is more likely to be damaged than the other VNW diodes 11. In this embodiment, by not providing the VNW diode 11 at the above corners, the concentration of the surge current flowing through a plurality of the VNW diodes 11 forming a matrix can be suppressed and the damage of the VNW diode 11 can be suppressed. Incidentally, in FIG. 15, it is assumed that the VNW diodes 11 at the lower left corner and the lower right corner are not provided, but the case where, for example, the VNW diodes 11 at the upper left corner and the upper right corner whose illustrations are omitted are not provided is also applicable. In other words, the case where the VNW diodes 11 at the four corners are not provided is also applicable.

MODIFIED EXAMPLE

Hereinafter, there are explained various modified examples of the semiconductor device in the second embodiment.

Modified Example 1

Figure 16:
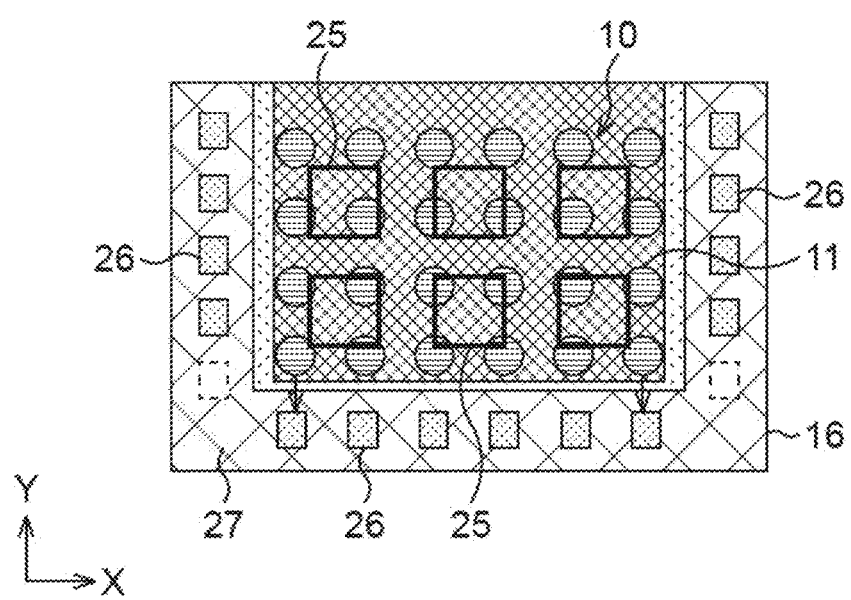
FIG. 16 is a plan view illustrating a schematic configuration of an ESD protection diode in a semiconductor device according to a modified example 1 of the second embodiment, from which wiring structures on contact plugs are removed.

FIG. 16 is a plan view illustrating a schematic configuration of an ESD protection diode in a semiconductor device according to a modified example 1 of the second embodiment, from which wiring structures on contact plugs are removed. Incidentally, the same components as those illustrated in FIG. 2 to FIG. 4C in the first embodiment are denoted by the same reference numerals and symbols and their detailed explanations are omitted.

In this example, the VNW diode group 10 includes a plurality of the VNW diodes 11 arranged in a matrix in the X direction and the Y direction. A plurality of the contact plugs 26 electrically connected to the Vdd power line 5 are provided in a row along the sides around the VNW diode group 10. Incidentally, in FIG. 16, out of the sides around the VNW diode group 10, the illustration of the upper side is omitted. Here, we focus on the not-facing two sides of the contact plugs 26. In this example, among the contact plugs 26 of these two sides, one of the two contact plugs 26 close to the VNW diode 11 at the corner in the matrix is missing. Here, in the row of the contact plugs 26 arranged in the Y direction, the contact plug 26 (illustrated by a solid line rectangle in FIG. 16) at one end close to the VNW diode 11 at the corner is missing.

When the contact plug 26 at one end close to the above-described VNW diode 11 at the corner is present, the surge current flows through the two contact plugs 26 positioned at respective ends of the not-facing two sides, and thus, the surge current tends to concentrate in the VNW diode 11 at the corner. Therefore, the VNW diode 11 at this corner is more likely to be damaged than the other VNW diodes 11. In this embodiment, by not providing one of the contact plugs 26 at the respective ends of the two sides close to the VNW diode 11 at this corner, the concentration of the surge current flowing through a plurality of the VNW diodes 11 forming a matrix can be suppressed and the damage of the VNW diode 11 can be suppressed. Incidentally, in FIG. 16, it is assumed that the contact plugs 26 at the lower left end and the lower right end are not provided, but the case where, for example, the contact plugs 26 at the upper left end and the upper right end whose illustrations are omitted are not provided is also applicable. Further, the case where among the contact plugs 26 arranged along the lower side and upper side (not illustrated), one or both of the contact plugs 26 at the left end and the right end are not provided is also applicable.

Modified Example 2

Figure 17:
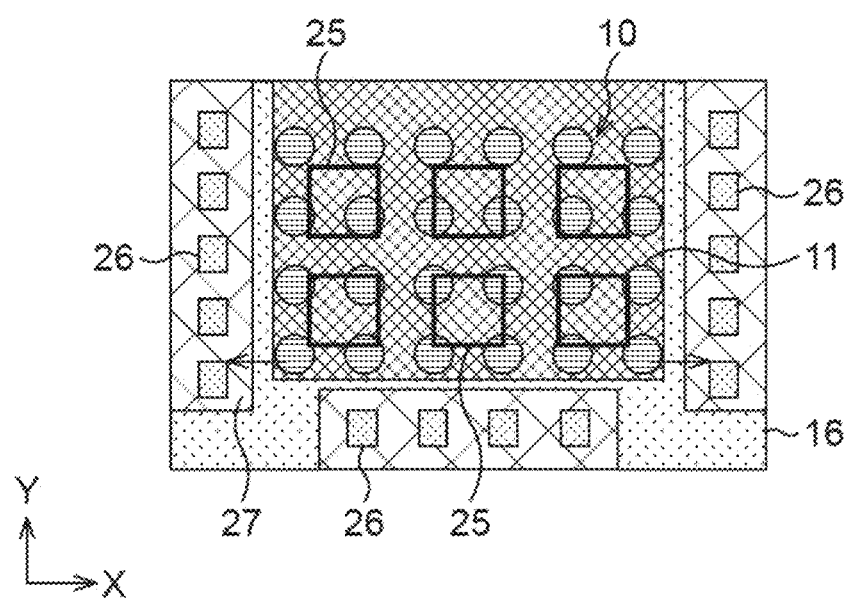
FIG. 17 is a plan view illustrating a schematic configuration of an ESD protection diode in a semiconductor device according to a modified example 2 of the second embodiment, from which wiring structures on contact plugs are removed.

FIG. 17 is a plan view illustrating a schematic configuration of an ESD protection diode in a semiconductor device according to a modified example 2 in the second embodiment, from which wiring structures on contact plugs are removed. Incidentally, the same components as those illustrated in FIG. 2 to FIG. 4C in the first embodiment are denoted by the same reference numerals and symbols and their detailed explanations are omitted.

In this example, the VNW diode group 10 includes a plurality of the VNW diodes 11 arranged in a matrix in the X direction and the Y direction. A plurality of the contact plugs 26 electrically connected to the Vdd power line 5 are provided in a row along the sides around the VNW diode group 10. Incidentally, in FIG. 17, out of the sides around the VNW diode group 10, the illustration of the upper side is omitted. In the first embodiment, among the contact plugs 26 arranged around the VNW diode group 10, the contact plugs 26 on the two sides arranged in the Y direction and the local interconnect 27 are formed integrally. In contrast to this, in this example, the local interconnect 27 arranged along the respective sides is not formed at the corners, and a separate arrangement is made. Further, at the corner where the local interconnect 27 is not arranged, the contact plug 26 is not arranged either.

In the case where the contact plug 26 and the local interconnect 27 are formed at each corner, the surge current flows between the VNW diode 11 and the contact plugs 26 positioned at the corner and the respective ends of the not-facing two sides. Therefore, the surge current is likely to concentrate in the VNW diode 11 at the corner. Thus, the VNW diode 11 at this corner is more likely to be damaged than the other VNW diodes 11.

In this example, the contact plug 26 and the local interconnect 27 are not arranged at each corner, and therefore, the paths of current flowing from the contact plug 26 at the corner to the contact plugs 26 in the vicinity thereof decrease. Therefore, the concentration of the current in the VNW diode 11 at this corner can be suppressed and the damage of the VNW diode 11 at this corner can be suppressed.

Incidentally, as in FIG. 17, the case where the ends of the local interconnect 27 arranged at the lower side recede from the corners and the contact plugs 26 are not arranged at the positions is also applicable. With such an arrangement, the surge current flowing from the VNW diode 11 at the corner to the contact plug 26 at the lower side decreases to enable further suppression of the damage caused by the concentration of the current in the VNW diode 11 at the corner. Further, the same configuration may be applied to the upper side whose illustration is omitted in FIG. 37. Further, the local interconnects 27 positioned at the respective sides may be electrically connected.

Third Embodiment

Figure 18:
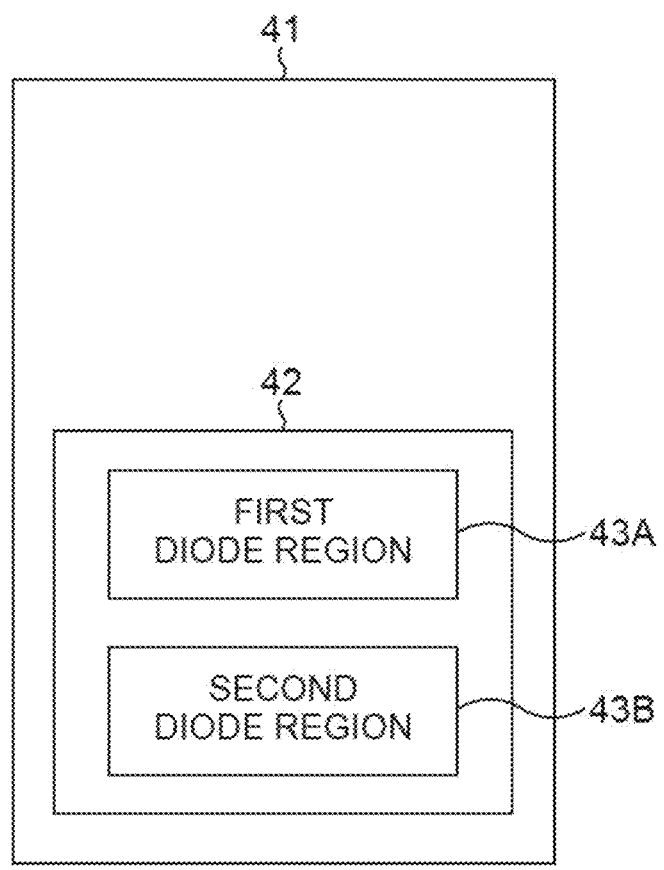
FIG. 18 is a schematic view illustrating an I/O circuit included in a semiconductor device according to a third embodiment.
Figure 19:
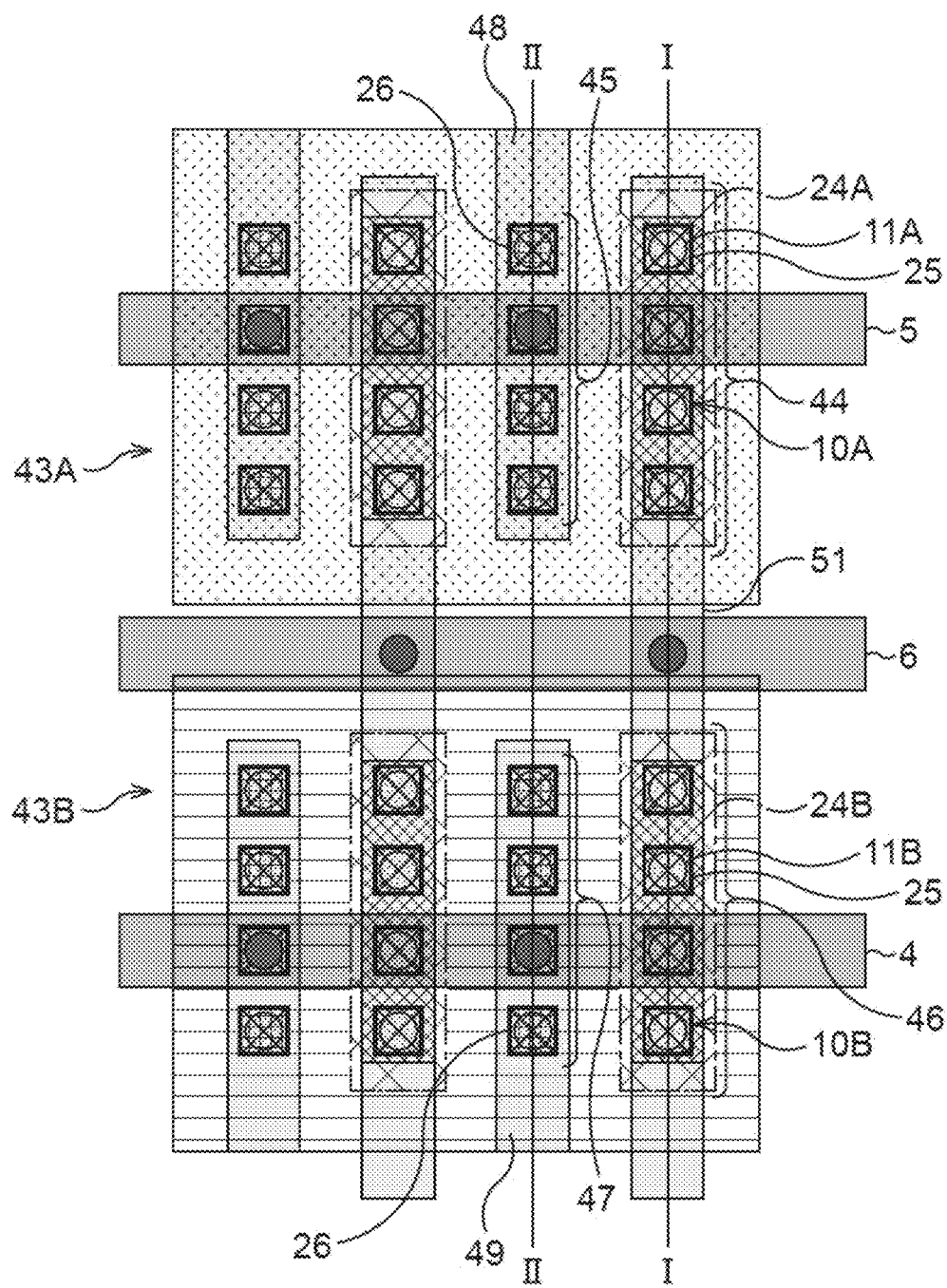
FIG. 19 is a plan view illustrating a schematic configuration of an ESD protection diode in the semiconductor device according to the third embodiment.
Figure 20A:
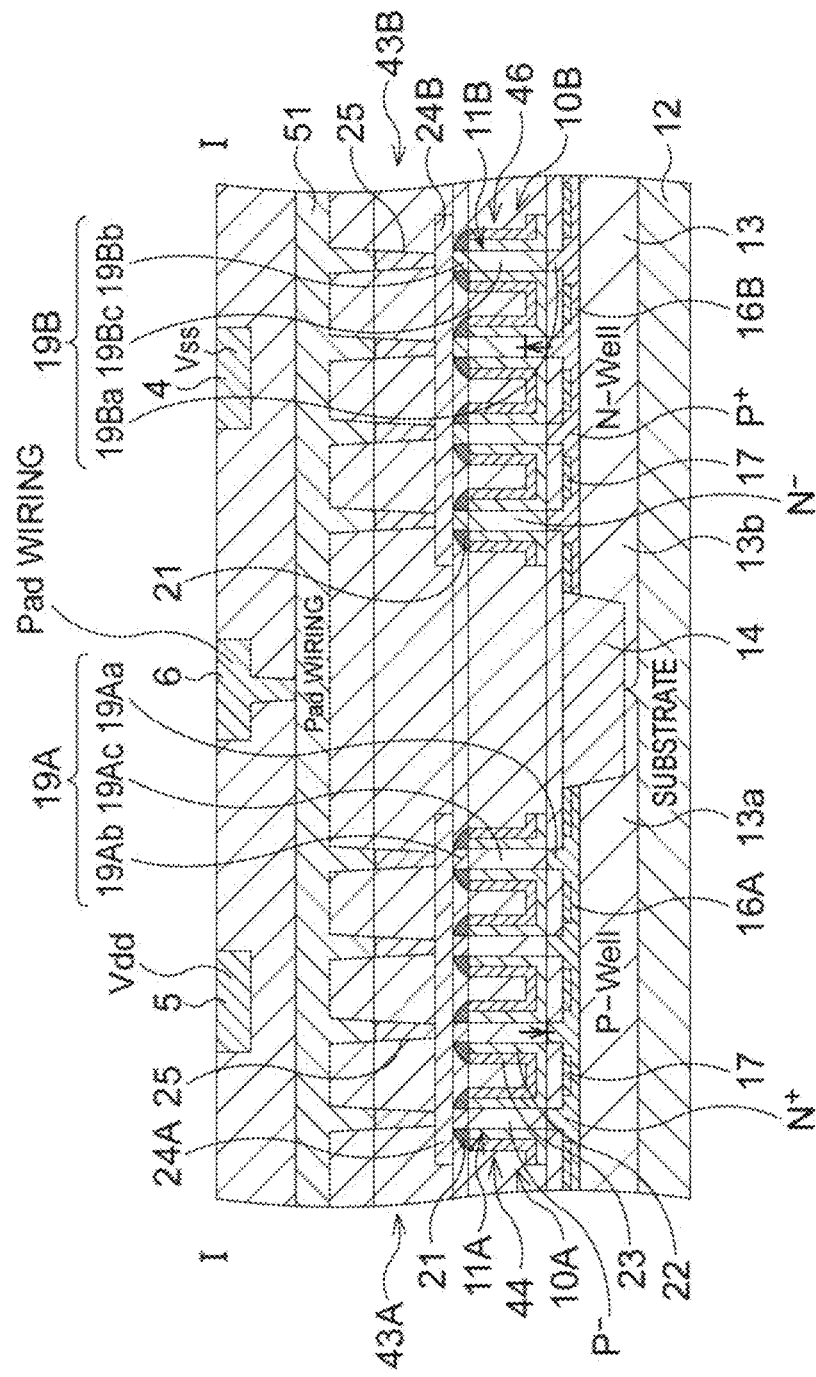
FIG. 20A is a cross-sectional view illustrating a cross section taken along a solid line I-I in FIG. 19.
Figure 20B:
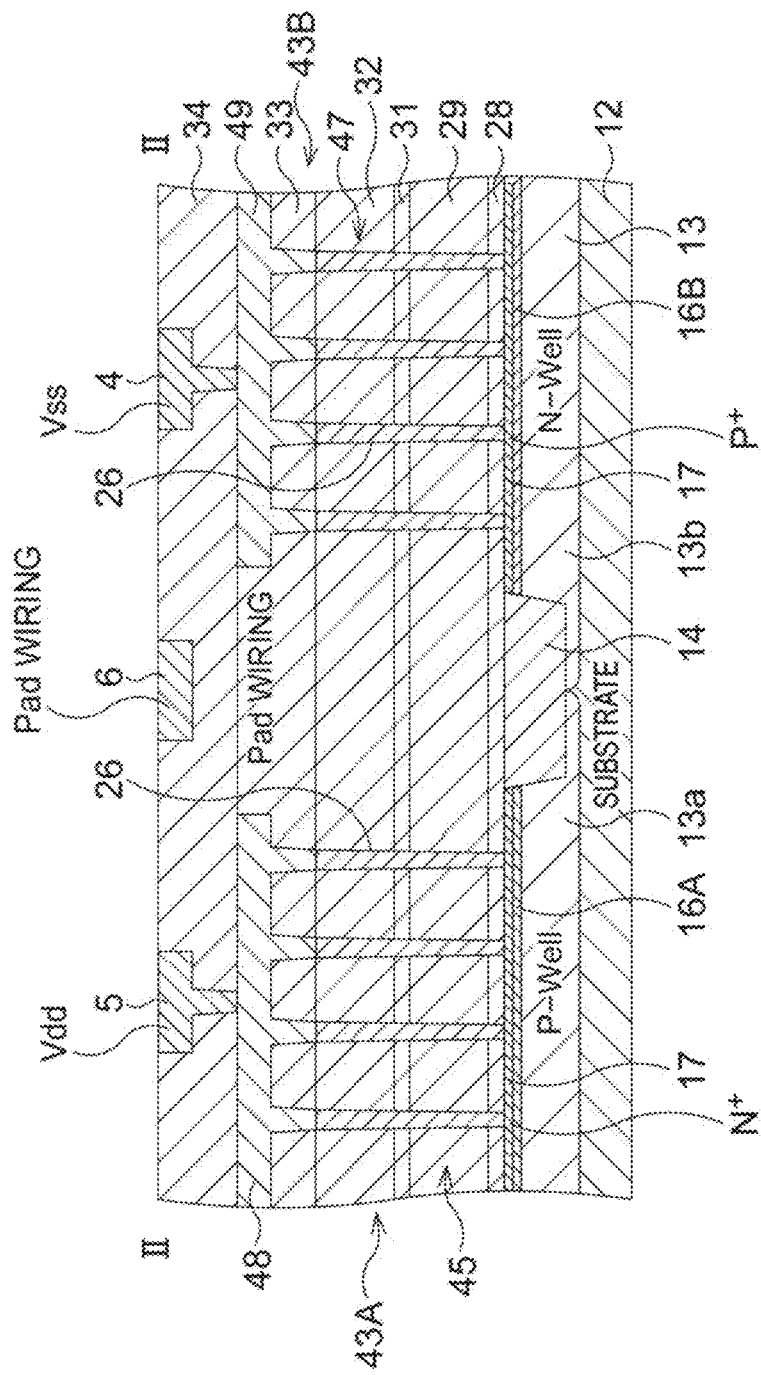
FIG. 20B is a cross-sectional view illustrating a cross section taken along a solid line II-II in FIG. 19.

Hereinafter, there is explained a third embodiment. FIG. 18 is a schematic view illustrating an I/O circuit included in a semiconductor device according to this embodiment. FIG. 19 is a plan view illustrating a schematic configuration of an ESD protection diode in the semiconductor device according to this embodiment. FIG. 20A is a cross-sectional view illustrating a cross section taken along a solid line I-I in FIG. 19. FIG. 20B is a cross-sectional view illustrating a cross section taken along a solid line II-II in FIG. 19.

The ESD protection diode in the semiconductor device according to this embodiment is provided as a protection circuit 42 being a part of an I/O circuit 41. The protection circuit 42 is provided with a first diode region 43A and a second diode region 43B. The first diode region 43A corresponds to the diode 2a in FIG. 1 in the first embodiment and the second diode region 43B corresponds to the diode 2b in FIG. 1 in the first embodiment respectively.

In the first diode region 43A, a first aggregate 44 and a second aggregate 45 are set as one unit and such one unit is repeatedly arranged in parallel with each other in a plane view.

The first aggregate 44 includes a VNW diode group 10A, a top plate 24A, and a plurality (four arranged in a row in the longitudinal direction, for example, here) of the contact plugs 25. The second aggregate 45 includes a plurality (four arranged in a row in the longitudinal direction, for example, here) of the contact plugs 26. Incidentally, in FIG. 19, two such units are arranged, but one such a unit may be arranged or the number of repetitions may be three or more.

In the first aggregate 44, a plurality of VNW diodes 11A are arranged in a row (or even in multiple rows) to form the VNW diode group 10A.

As illustrated in FIG. 20A and FIG. 20B, on the semiconductor substrate 12 in the first diode region 43A, a P well 13a having a P-type conductivity type, for example, is formed. On the top of the P well 13a, a bottom region 16A having an N-type conductivity type is formed. The silicide layer 17 is formed on the surface of the semiconductor substrate 12 being the top of the bottom region 16A. On the semiconductor substrate 12 in the first diode region 43A, a plurality of projecting semiconductor nanowires 19A are formed vertically to the surface of the semiconductor substrate 12. The VNW diode 11A is formed with each of a plurality of the semiconductor nanowires 19A each having a lower end portion 19Aa, an upper end portion 19Ab, and a middle portion 19Ac between the lower end portion 19Aa and the upper end portion 19Ab. The lower end portion 19Aa has an N-type conductivity type and is electrically connected to the bottom region 16A. The upper end portion 19Ab has a P-type conductivity type. The middle portion 19Ac has a P-type conductivity type and forms a PN junction with the lower end portion 19Aa. On side surfaces of the upper end portion 19Ab, the insulating film sidewall 21 is formed. The lower end portions 19Aa of a plurality of the semiconductor nanowires 19A are electrically connected to each other by the bottom region 16A. Incidentally, the concentration of a P-type impurity of the middle portion 19Ac may be lower than or equal to that of the upper end portion 19Ab. Further, in the case where the semiconductor substrate 12 is a P-type substrate, the formation of the P well 13a may be omitted.

On side surfaces of the semiconductor nanowire 19A, the gate electrode 23 is formed via the gate insulating film 22. The gate electrodes 23 of a plurality of the semiconductor nanowires 19A may be formed separately from each other, or may be formed in whole or in part as a single-layer conductive film. Incidentally, the gate insulating film 22 and the gate electrode 23 are formed simultaneously with a gate insulating film and a gate electrode of transistors of the logic circuit as described later, and the formations of them may be omitted for the VNW diode 11A.

The top plate 24A being a conductive film of silicide, metal, or the like, is formed on a plurality of the semiconductor nanowires 19A. The upper end portions 19Ab of the semiconductor nanowires 19A of the respective VNW diodes 11A are electrically connected to each other via the top plate 24A. The overall top plate 24A, as a single conductive film, for example, conducts with the respective VNW diodes 11A.

A plurality of the contact plugs 25 are arranged in a row (or even in multiple rows) on the top plate 24A, and the respective contact plugs 25 are electrically connected to the top plate 24A. The respective contact plugs 25 are arranged overlapping the respective VNW diodes 11A in a plane view. However, the respective contact plugs 25 are sometimes arranged to be displaced from the respective VNW diodes 11A in a plane view.

The second aggregate 45 includes a plurality of the contact plugs 26 arranged in a row in parallel with the first aggregate 44 in a plane view. The contact plugs 26 are in contact with the silicide layer 17 and are electrically connected to the lower end portions 19Aa of the respective VNW diodes 11A via the silicide layer 17 and the bottom region 16A.

In the second diode region 43B, a first aggregate 46 and a second aggregate 47 are set as one unit and such one unit is repeatedly arranged in parallel with each other in a plane view.

The first aggregate 46 includes a VNW diode group 10B, a top plate 24B, and a plurality (four arranged in a row in the longitudinal direction, for example, here) of the contact plugs 25. The second aggregate 47 includes a plurality (four arranged in a row in the longitudinal direction, for example, here) of the contact plugs 26. Incidentally, in FIG. 19, two such units are arranged, but one such a unit may be arranged or the number of repetitions may be three or more.

In the first aggregate 46, a plurality of VNW diodes 11B are arranged in a row (or even in multiple rows) to form the VNW diode group 10.

As illustrated in FIG. 20A and FIG. 20B, on the semiconductor substrate 12 in the second diode region 43B, an N well 13b having an N-type conductivity type, for example, is formed. On the top of the N well 13b, a bottom region 16B having a P-type conductivity type is formed. The silicide layer 17 is formed on the surface of the semiconductor substrate 12 being the top of the bottom region 16B. On the semiconductor substrate 12 in the second diode region 43B, a plurality of projecting semiconductor nanowires 19B are formed vertically to the surface of the semiconductor substrate 12. The VNW diode 11B is formed with each of a plurality of the semiconductor nanowires 19B each having a lower end portion 19Ba, an upper end portion 19Bb, and a middle portion 19Bc between the lower end portion 19Ba and the upper end portion 19Bb. The lower end portion 19Ba has a P-type conductivity type and is electrically connected to the bottom region 16B. The upper end portion 19Bb has an N-type conductivity type. The middle portion 19Bc has an N-type conductivity type and forms a PN junction with the lower end portion 19Ba. On side surfaces of the upper end portion 19Bb, the insulating film sidewall 21 is formed. The lower end portions 19Ba of a plurality of the semiconductor nanowires 19B are electrically connected to each other by the bottom region 16B. Incidentally, the concentration of an N-type impurity of the middle portion 19Bc may be lower than or equal to that of the upper end portion 19Bb. Further, in the case where the semiconductor substrate 12 is an N-type substrate, the formation of the N well 13b may be omitted.

On side surfaces of the semiconductor nanowire 19B, the gate electrode 23 is formed via the gate insulating film 22. The gate electrodes 23 of a plurality of the semiconductor nanowires 19B may be formed separately from each other, or may be formed in whole or in part as a single-layer conductive film. Incidentally, the gate insulating film 22 and the gate electrode 23 are formed simultaneously with a gate insulating film and a gate electrode of transistors of the logic circuit as described later, and the formations of them may be omitted for the VNW diode 11B.

The top plate 24B being a conductive film of silicide, metal, or the like, is formed on a plurality of the semiconductor nanowires 19B. The upper end portions 19Bb of the semiconductor nanowires 19B of the respective VNW diodes 11B are electrically connected to each other via the top plate 24B. The overall top plate 24B, as a single conductive film, for example, conducts with the respective VNW diodes 11B.

A plurality of the contact plugs 25 are arranged in a row (or even in multiple rows) on the top plate 24B, and the respective contact plugs 25 are electrically connected to the surface of the top plate 24B. The respective contact plugs 25 are arranged overlapping the respective VNW diodes 11B in a plane view. However, the respective contact plugs 25 are sometimes arranged to be displaced from the respective VNW diodes 11B in a plane view.

The second aggregate 47 includes a plurality of the contact plugs 26 arranged in a row in parallel with the first aggregate 46 in a plane view. The contact plugs 26 are in contact with the silicide layer 17 and are electrically connected to the lower end portions 19Ba of the respective VNW diodes 11B via the silicide layer 17 and the bottom region 16B.

On a plurality of the contact plugs 26 in the first diode region 43A, for example, a single wiring structure 48 is arranged so as to overlap the second aggregate 45 in a plane view. The wiring structure 48 is formed by a dual damascene method, for example. The wiring structure 48 is electrically connected to a plurality of the contact plugs 26 in the first diode region 43A. On a plurality of the contact plugs 26 in the first diode region 43B, for example, a single wiring structure 49 is arranged so as to overlap the second aggregate 47 in a plane view. The wiring structure 49 is formed by a dual damascene method, for example. The wiring structure 49 is electrically connected to a plurality of the contact plugs 26 in the second diode region 43B.

On a plurality of the contact plugs 25 in the first diode region 43A and a plurality of the contact plugs 25 in the second diode region 43B, for example, a single wiring structure 51 is arranged in common to both the regions so as to overlap the first aggregate 44 and the first aggregate 46 in a plane view. The wiring structure 51 is formed by a dual damascene method, for example. The wiring structure 51 is electrically connected to the contact plugs 25. The wiring structure 51 and the wiring structures 48, 49 are arranged in parallel with each other.

In the first diode region 43A, the Vdd power line 5 is arranged on the wiring structures 48, 51 so as to intersect with the wiring structures 48, 51 in a plane view. The Vdd power line 5 is formed by a dual damascene method, for example. The Vdd power line 5 is electrically connected to the lower end portions 19Aa of the respective VNW diodes 11A via the wiring structure 48, the contact plugs 26, the silicide layer 17, and the bottom region 16A. In the second diode region 43B, the Vss power line 4 is arranged on the wiring structures 49, 51 so as to intersect with the wiring structures 49, 51 in a plane view. The Vss power line 4 is formed by a dual damascene method, for example. The Vss power line 4 is electrically connected to the lower end portions 19Ba of the respective VNW diodes 11B via the wiring structure 49, the contact plugs 26, the silicide layer 17, and the bottom region 16B. Between the first diode region 43A and the second diode region 43B, the pad wiring 6 is arranged on the wiring structure 51 so as to intersect with the wiring structure 51 in a plane view. The pad wiring 6 is formed by a dual damascene method, for example. The pad wiring 6 is electrically connected to the wiring structure 51. Incidentally, the conductivity types of the lower end portion 19Aa of the VNW diode 11A and the bottom region 16A and the conductivity type of the upper end portion 19Ab may be reversed, and the Vdd power line 5 may be electrically connected to the upper end portions 19Ab and the Pad wiring 6 may be electrically connected to the lower end portions 19Aa. Further, the conductivity types of the lower end portion 19Ba of the VNW diode 11B and the bottom region 16B and the conductivity type of the upper end portion 19Bb may be reversed, and the Vas power line 4 may be electrically connected to the upper end portions 19Bb and the Pad wiring 6 may be electrically connected to the lower end portions 19Ba.

The VNW diodes 11A, 11B and part of the contact plugs 26 are formed in the insulating film 28 and the interlayer insulating films 29, 31. The top plates 24A, 24B, the contact plugs 25, and another part of the contact plugs 26 are formed in the interlayer insulating film 32. The wiring structures 48, 49, and 51 are formed in the interlayer insulating film 33. The Vss power line 4, the Vdd power line 5, and the pad wiring 6 are formed in an interlayer insulating film 34.

As explained above, according to this embodiment, a plurality of the VNW diodes are electrically connected to the top plate in the ESD protection diode. As a result, even when large current flows through the VNW diode, the current concentration can be suppressed and the damage of the VNW diode can be suppressed.

Fourth Embodiment

Figure 21:
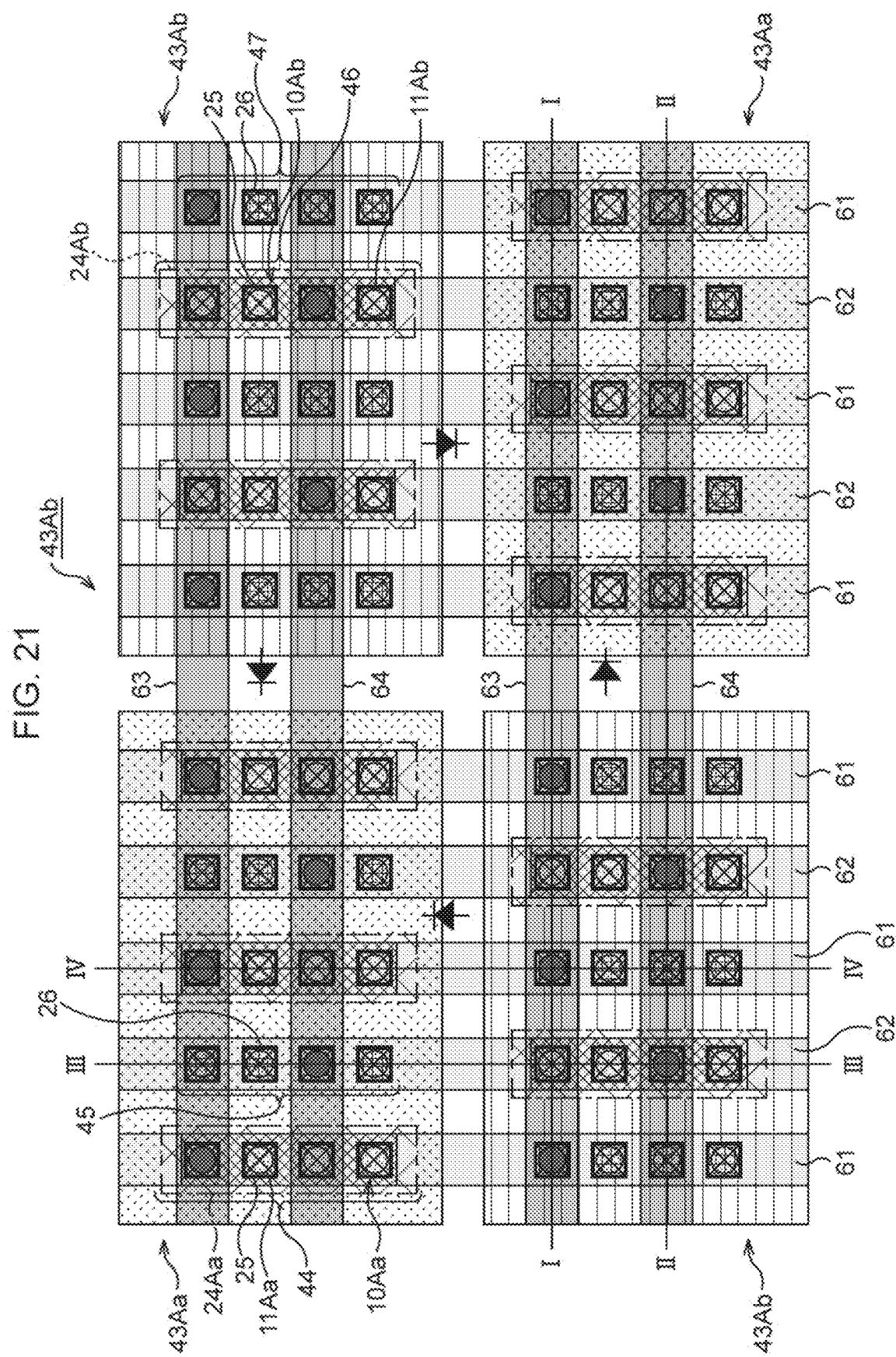
FIG. 21 is a plan view illustrating a schematic configuration of an ESD protection diode in a semiconductor device according to a fourth embodiment.
Figure 22A:
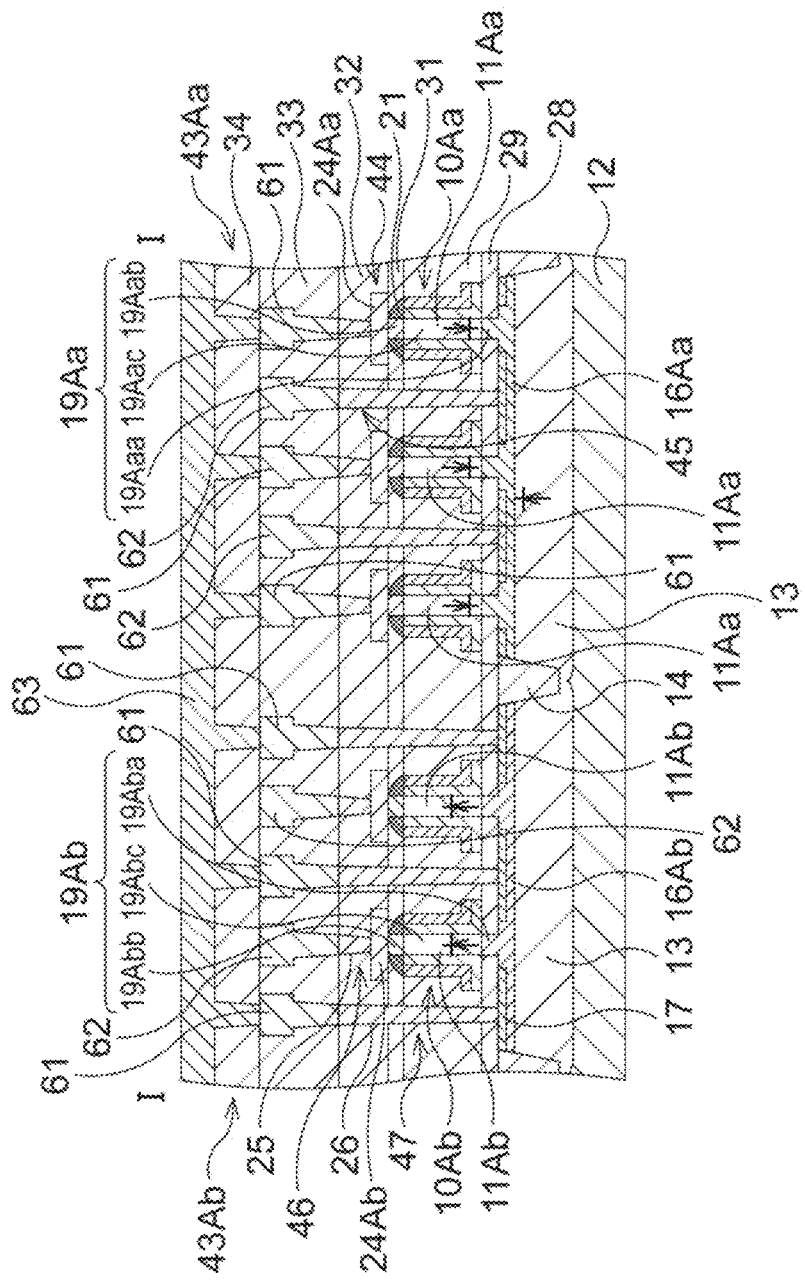
FIG. 22A is a cross-sectional view illustrating a cross section taken along a solid line I-I in FIG. 21.
Figure 22C:
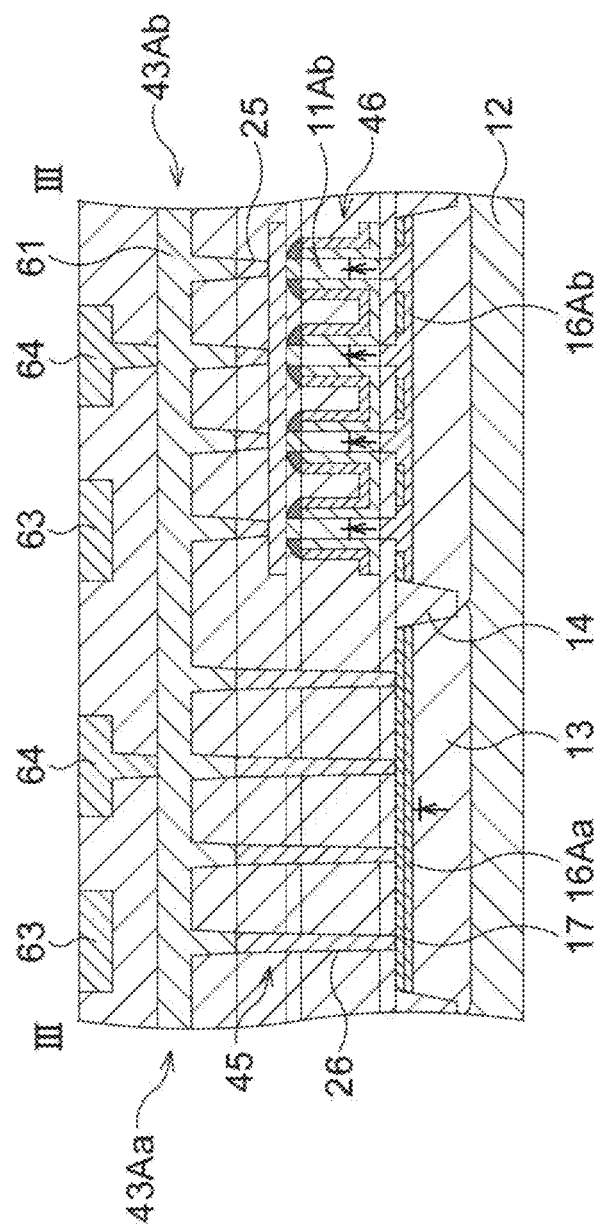
FIG. 22C is a cross-sectional view illustrating a cross section taken along a solid line III-III in FIG. 21.
Figure 22D:
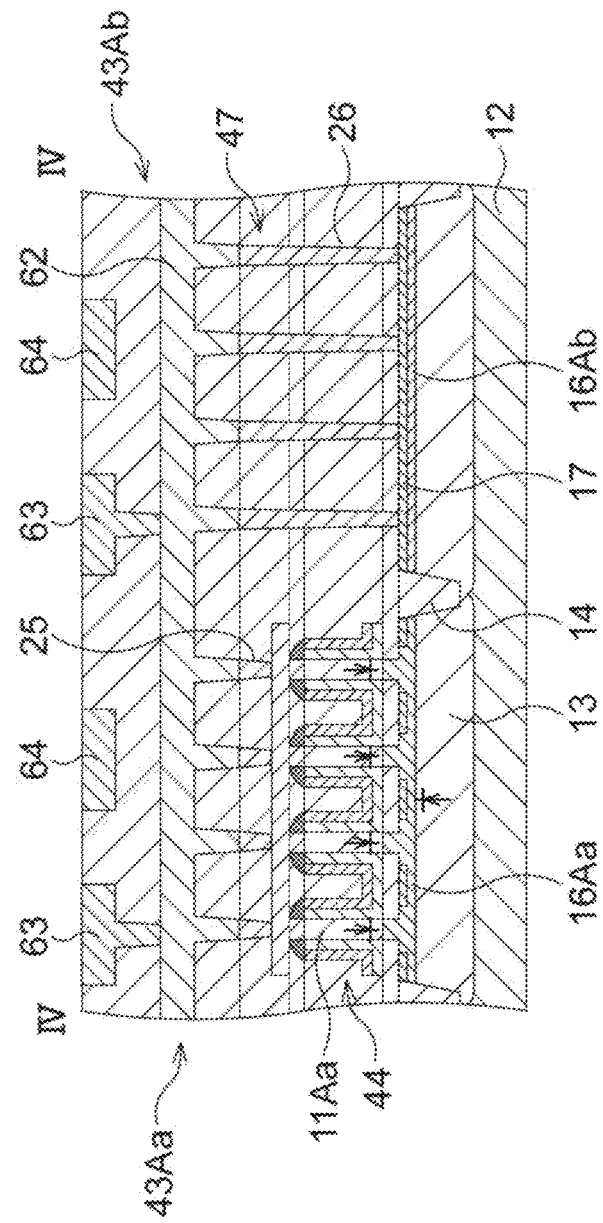
FIG. 22D is a cross-sectional view illustrating a cross section taken along a solid line IV-IV in FIG. 21.

Hereinafter, there is explained a fourth embodiment. FIG. 21 is a plan view illustrating a schematic configuration of an ESD protection diode in a semiconductor device according to this embodiment. FIG. 22A is a cross-sectional view illustrating a cross section taken along a solid line I-I in FIG. 21. FIG. 22B is a cross-sectional view illustrating a cross section taken along a solid line II-II in FIG. 21. FIG. 22C is a cross-sectional view illustrating a cross section taken along a solid line III-III in FIG. 21. FIG. 22D is a cross-sectional view illustrating a cross section taken along a solid line IV-IV in FIG. 21.

The ESD protection diode in the semiconductor device according to this embodiment is contained in the first diode region 43A and is provided with first regions 43Aa and second regions 43Ab. The first regions 43Aa and the second regions 43Ab are arranged in a staggered shape in a plane view, for example. The first diode region 43A corresponds to the diode 2a in FIG. 1 in the first embodiment.

In the first region 43Aa, the first aggregate 44 and the second aggregate 45 are set as one unit and such one unit is repeatedly arranged in parallel with each other in a plane view.

The first aggregate 44 includes a VNW diode group 10Aa, a top plate 24Aa, and a plurality (four arranged in a row in the longitudinal direction, for example, here) of the contact plugs 25. The second aggregate 45 includes a plurality (four arranged in a row in the longitudinal direction, for example, here) of the contact plugs 26. Incidentally, in FIG. 21, three first aggregates 44 and two second aggregates 45 are arranged, but, for example, two first aggregates 44 and one second aggregate 45 may be arranged, or three or more first aggregates 44 and four or more second aggregates 45 may be arranged.

In the first aggregate 44, a plurality of VNW diodes 11Aa are arranged in a row (or even in multiple rows) to form the VNW diode group 10Aa.

As illustrated in FIG. 22A to FIG. 22D, on the semiconductor substrate 12 in the first region 43Aa, the P well 13 having a P-type conductivity type, for example, is formed. On the top of the P well 13, a bottom region 16Aa having an N-type conductivity type is formed. The silicide layer 17 is formed on the surface of the semiconductor substrate 12 being the top of the bottom region 16Aa. On the semiconductor substrate 12 in the first region 43Aa, a plurality of projecting semiconductor nanowires 19Aa are formed vertically to the surface of the semiconductor substrate 12. The VNW diode 11Aa is formed with each of a plurality of the semiconductor nanowires 19Aa each having a lower end portion 19Aaa, an upper end portion 19Aab, and a middle portion 19Aac between the lower end portion 19Aaa and the upper end portion 19Aab. The lower end portion 19Aaa has an N-type conductivity type and is electrically connected to the bottom region 16Aa. The upper end portion 19Aab has a P-type conductivity type. The middle portion 19Aac has a P-type conductivity type and forms a PN junction with the lower end portion 19Aaa. On side surfaces of the upper end portion 19Aab, the insulating film sidewall 21 is formed. The lower end portions 19Aaa of a plurality of the semiconductor nanowires 19Aa are electrically connected to each other by the bottom region 16Aa. Incidentally, the concentration of a P-type impurity of the middle portion 19Aac may be lower than or equal to that of the upper end portion 19Aab. Further, in the case where the semiconductor substrate 12 is a P-type substrate, the formation of the P well 13 may be omitted.

On side surfaces of the semiconductor nanowire 19Aa, the gate electrode 23 is formed via the gate insulating film 22. The gate electrodes 23 of a plurality of the semiconductor nanowires 19Aa may be formed separately from each other, or may be formed in whole or in part as a single-layer conductive film. Incidentally, the gate insulating film 22 and the gate electrode 23 are formed simultaneously with a gate insulating film and a gate electrode of transistors of the logic circuit as described later, and the formations of them may be omitted for the VNW diode 11Aa. Further, the overall gate electrode 23 does not have to be conductive as a single-layer electric conductor, and may be formed into a plurality of pieces separately in the VNW diode group 10Aa, for example.

The top plate 24Aa being a conductive film of silicide, metal, or the like, is formed on a plurality of the semiconductor nanowires 19Aa. The semiconductor nanowires 19Aa of the respective VNW diodes 11Aa are electrically connected to each other via the top plate 24Aa. The overall top plate 24Aa, as a single conductive film, for example, conducts with the respective VNW diodes 11Aa.

A plurality of the contact plugs 25 are arranged in a row (or even in multiple rows) on the top plate 24Aa, and the respective contact plugs 25 are electrically connected to the surface of the top plate 24Aa. The respective contact plugs 25 are arranged overlapping the respective VNW diodes 11Aa in a plane view. However, the respective contact plugs 25 are sometimes arranged to be displaced from the respective VNW diodes 11A in a plane view.

The second aggregate 45 includes a plurality of the contact plugs 26 arranged in a row in parallel with the first aggregate 44 in a plane view. The contact plugs 26 are in contact with the silicide layer 17 and are electrically connected to the lower end portions 19Aaa of the respective VNW diodes 11Aa via the silicide layer 17 and the bottom region 16Aa.

In the second region 43Ab, the first aggregate 46 and the second aggregate 47 are set as one unit and such one unit is repeatedly arranged in parallel with each other in a plane view.

The first aggregate 46 includes a VNW diode group 10Ab, a top plate 24Ab, and a plurality (four arranged in a row in the longitudinal direction, for example, here) of the contact plugs 25. The second aggregate 47 includes a plurality (four arranged in a row in the longitudinal direction, for example, here) of the contact plugs 26. Incidentally, in FIG. 21, three first aggregates 46 and two second aggregates 47 are arranged, but, for example, two first aggregates 46 and one second aggregate 47 may be arranged, or three or more first aggregates 46 and four or more second aggregates 47 may be arranged.

In the first aggregate 46, a plurality of VNW diodes 11Ab are arranged in a row (or even in multiple rows) to form the VNW diode group 10Ab.

As illustrated in FIG. 21A to FIG. 21D, on the semiconductor substrate 12 in the second region 43Ab, the P well 13 having a P-type conductivity type, for example, is formed. On the top of the P well 13, a bottom region 16Ab having a P-type conductivity type is formed. The silicide layer 17 is formed on the surface of the semiconductor substrate 12 being the top of the bottom region 16Ab. On the semiconductor substrate 12 in the second region 43Ab, a plurality of projecting semiconductor nanowires 19Ab are formed vertically to the surface of the semiconductor substrate 12. The VNW diode 11Ab is formed with each of a plurality of the semiconductor nanowires 19Ab each having a lower end portion 19Aba, an upper end portion 19Abb, and a middle portion 19Abc between the lower end portion 19Aba and the upper end portion 19Abb. The lower end portion 19Aba has a P-type conductivity type and is electrically connected to the bottom region 16Ab. The upper end portion 19Abb has an N-type conductivity type. The middle portion 19Abc has an N-type conductivity type and forms a PN junction with the lower end portion 19Aba. On side surfaces of the upper end portion 19Abb, the insulating film sidewall 21 is formed. The lower end portions 19Aba of a plurality of the semiconductor nanowires 19Ab are electrically connected to each other by the bottom region 16Ab. Incidentally, the concentration of an N-type impurity of the middle portion 19Abc may be lower than or equal to that of the upper end portion 19Abb. Further, in the case where the semiconductor substrate 12 is a P-type substrate, the formation of the P well 13 may be omitted.

On side surfaces of the semiconductor nanowire 19Ab, the gate electrode 23 is formed via the gate insulating film 22. The gate electrodes 23 of a plurality of the semiconductor nanowires 19Ab may be formed separately from each other, or may be formed in whole or in part as a single-layer conductive film. Incidentally, the gate insulating film 22 and the gate electrode 23 are formed simultaneously with a gate insulating film and a gate electrode of transistors of the logic circuit as described later, and the formations of them may be omitted for the VNW diode 11Ab. Further, the overall gate electrode 23 does not have to be conductive as a single-layer electric conductor, and may be formed into a plurality of pieces separately in the VNW diode group 10Ab, for example.

The top plate 24Ab being a conductive film of silicide, metal, or the like, is formed on a plurality of the semiconductor nanowires 19Ab. The semiconductor nanowires 19Ab of the respective VNW diodes 11Ab are electrically connected to each other via the top plate 24Ab. The overall top plate 24Ab, as a single conductive film, for example, conducts with the respective VNW diodes 11Ab.

A plurality of the contact plugs 25 are arranged in a row (or even in multiple rows) on the top plate 24Ab, and the respective contact plugs 25 are electrically connected to the surface of the top plate 24Ab. The respective contact plugs 25 are arranged overlapping the respective VNW diodes 11Ab positioned therebelow in a plane view. However, the respective contact plugs 25 are sometimes arranged to be displaced from the respective VNW diodes 11Ab in a plane view.

In this embodiment, the first region 43Aa and the second region 43Ab are arranged in a staggered shape alternately in each of the X direction and the Y direction in a plane view. In this case, a diode (a parasitic diode) is also formed between the first region 43Aa and the second region 43Ab that are adjacent to each other in the X direction and the Y direction. Concretely, the bottom region 16Ab in the second region 43Ab is electrically connected to the P well 13 in the first region 43Aa, and a parasitic diode is formed by a PN junction between the bottom region 16Aa in the first region 43Aa and the P well 13. In this configuration, the respective semiconductor nanowires 19Aa and the respective semiconductor nanowires 19Ab function as an ESD diode. Further, the parasitic diode formed between the first region 43Aa and the second region 43Ab that are adjacent to each other also functions as an ESD diode.

The second aggregate 47 includes a plurality of the contact plugs 26 arranged in a row in parallel with the first aggregate 46. The contact plugs 26 are in contact with the silicide layer 17 and are electrically connected to the semiconductor nanowires 19Ab of the respective VNW diodes 11Ab via the silicide layer 17 and the bottom region 16Ab.

In this embodiment, considering the arrangement efficiency, in the first region 43Aa and the second region 43Ab that are arranged alternately in the Y direction, the first aggregate 44 and the second aggregate 47 are arranged in a row along the Y direction. Further, the second aggregate 45 and the first aggregate 46 are arranged in a row along the Y direction.

A plurality of the contact plugs 25 in the first region 43Aa and a plurality of the contact plugs 26 in the second region 43Ab that are arranged alternately in the Y direction are electrically connected to a wiring structure 61. The wiring structure 61 is arranged on the first aggregate 44 and the second aggregate 47 in common to both the regions so as to overlap them in a plane view. The wiring structure 61 is formed by a dual damascene method, for example.

A plurality of the contact plugs 26 in the first region 43Aa and a plurality of the contact plugs 25 in the second region 43Ab that are arranged alternately in the Y direction are electrically connected to a wiring structure 62. The wiring structure 62 is arranged on the second aggregate 45 and the first aggregate 46 in common to both the regions so as to overlap them in a plane view. The wiring structures 62 are electrically connected. The wiring structure 62 is formed by a dual damascene method, for example.

In the first region 43Aa and the second region 43Ab that are arranged alternately in the X direction, a first wiring structure 63 is provided above the wiring structures 61, 62. The first wiring structure 63 intersects with the wiring structures 61, 62 in a plane view. The first wiring structure 63 is formed by a dual damascene method, for example, and is electrically connected to the contact plugs 25 of the first aggregates 44 in the first region 43Aa and is electrically connected to a plurality of the contact plugs 26 of the second aggregates 47 in the second region 43Ab respectively. In the first region 43Aa and the second region 43Ab that are arranged alternately in the X direction, a second wiring structure 64 is provided on the wiring structures 61, 62. The second wiring structure 64 intersects with the wiring structures 61, 62 in a plane view. The second wiring structure 64 is formed by a dual damascene method, for example, and is electrically connected to the contact plugs 26 of the second aggregates 45 in the first region 43Aa and is electrically connected to a plurality of the contact plugs 25 of the first aggregates 46 in the second region 43Ab respectively.

The first wiring structure 63 and the second wiring structure 64 are arranged alternately in parallel with each other in a plane view, for example. The first wiring structure 63 is a pad wiring, and is electrically connected to the upper end portions 19Aab in the first region 43Aa and is electrically connected to the lower end portions 19Aba in the second region 43Ab. The second wiring structure 64 is a Vdd power line, and is electrically connected to the upper end portions 19Aab in the first region 43Aa and is electrically connected to the lower end portions 19Aba in the second region 43Ab.

The VNW diodes 11Aa, 11Ab are formed in the insulating film 28 and the interlayer insulating films 29, 31. The top plates 24Aa, 24Ab and the contact plugs 25, 26 are formed in the interlayer insulating film 32. The wiring structures 61, 62 are formed in the interlayer insulating film 33. The first wiring structures 63 and the second wiring structures 64 are formed in the interlayer insulating film 34.

As explained above, according to this embodiment, in the ESD protection diode, a plurality of the VNW diodes are electrically connected to the top plate. As a result, even when large current flows through the VNW diode, the current concentration can be suppressed and the damage of the VNW diode can be suppressed. Incidentally, in this embodiment, the diode 2a has been explained as an example, but for example, the diode 2b is also applicable. In this case, for example, the first wiring structure 63 may be set to the Pad wiring 6 and the second wiring structure 64 may be set to the Vss power line 4.

Fifth Embodiment

Hereinafter, there is explained a fifth embodiment. In this embodiment, manufacturing methods of resistors and MOS transistors are explained together with the ESD protection diodes explained in the first to fourth embodiments.

FIG. 23 to FIG. 35 each are a schematic cross-sectional view illustrating a manufacturing method of a semiconductor device according to this embodiment, in order of processes. In each of the drawings, the ESD protection diode is formed in a diode formation region R2. The MOS transistor is formed in a transistor formation region R1 and the resistor element is formed in a resistor element formation region R3 respectively. Incidentally, the MOS transistor formed in the transistor formation region R1 and the resistor element formed in the resistor element formation region R3 may be arranged in s semiconductor circuit being a protection object of the ESD protection diode.

Figure 23:
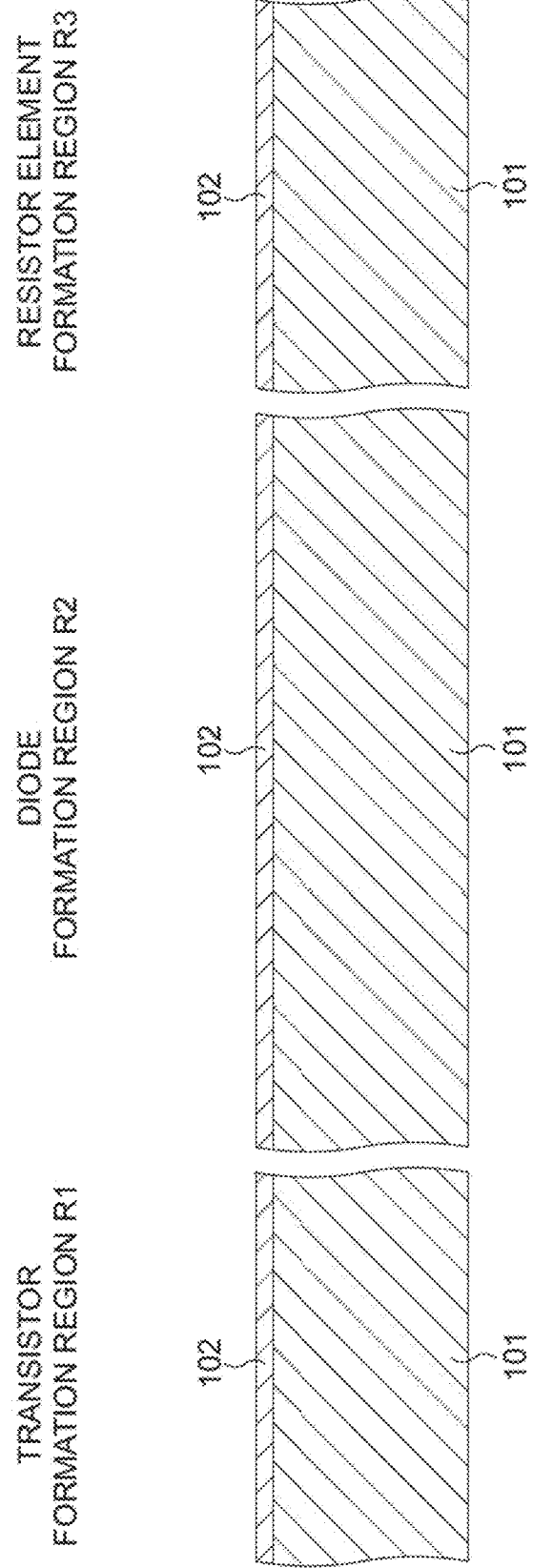
FIG. 23 is a schematic cross-sectional view illustrating a manufacturing method of a semiconductor device according to a fifth embodiment, in order of processes.

First, as illustrated in FIG. 23, a mask layer 102 is formed on a surface of a substrate 101. Concretely, first, the substrate 101 is prepared. As the substrate 101, a substrate of a compound or an alloy of bulk Si, germanium (Ge), Si, or Ge, or a substrate of one type selected from SiC, SiP, SiPC, GaAs, GaP, InP, InAs, In, Sb, SiGe, GaAcP, AllnAs, GaInAs, GaInP, and GaInAsP, a combination of these, or the like is used. An SOI substrate can also be used.

Figure 24:
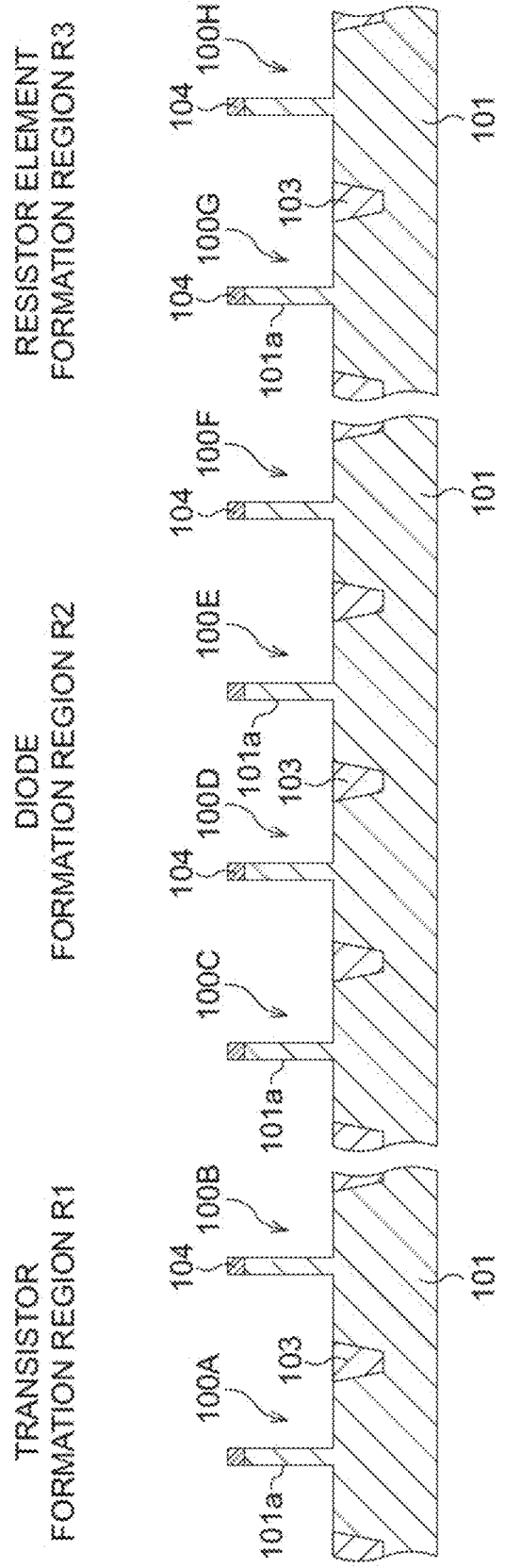
FIG. 24, which continues from FIG. 23, is a schematic cross-sectional view illustrating the manufacturing method of the semiconductor device according to the fifth embodiment, in order of processes.

Then, as illustrated in FIG. 24, VNWs 101a and STI element isolation structures 103 are formed on and in the substrate 101. For convenience of illustration, in the transistor formation region R1, two VNWs 101a arranged in active regions 100A and 100B are illustrated as an example. Further, in the diode formation region R2, four VNWs 101a arranged in active regions 100C, 100D, 100E, and 100F are illustrated as an example. Further, in the resistor element formation region R3, two VNWs 101a arranged in active regions 100G and 100H are illustrated as an example. The VNW 101a may be formed by etching the substrate 101 while using a hard mask 104 formed thereon as a mask. The material of the hard mask 104 is, for example, SiC, SiN, SiON, or SiCN, or a combination of these. Further, a semiconductor material may be epitaxially grown on the substrate 101 to form the VNW 101a. Further, a plane shape of the VNW 101a may be, for example, a circular shape, an elliptical shape, a quadrangular shape, or a shape extending in one direction.

Further, the substrate 101 is etched to form openings and an insulating material is formed in the openings, and thereby the STI element isolation structures 103 are formed. The insulating material may be, for example, SiO, PSG (phosphorous silicate glass), BSG (boron silicate glass), BPSG (boron phosphorous silicate glass), USG (undoped silicate glass), or a combination of these. The STI element isolation structure 103 may be formed before the VNW 101a or after the VNW 101a.

Figure 25:
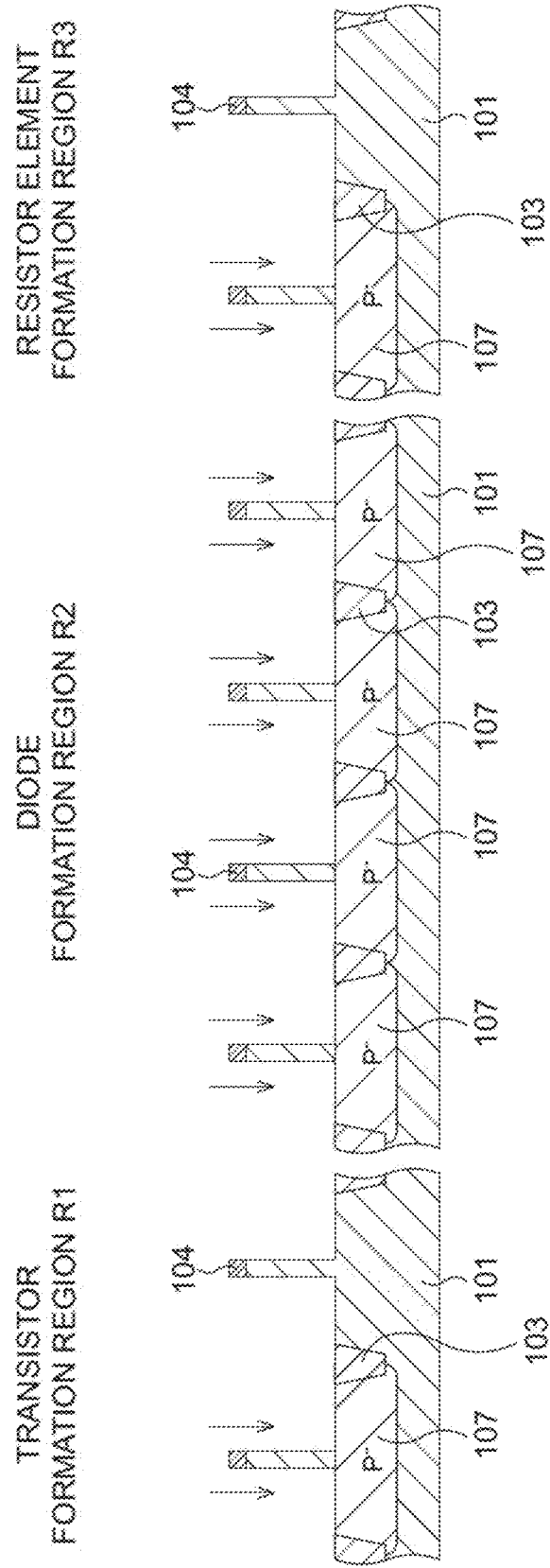
FIG. 25, which continues from FIG. 24, is a schematic cross-sectional view illustrating the manufacturing method of the semiconductor device according to the fifth embodiment, in order of processes.

Then, as illustrated in FIG. 25, wells 107 having a P-type conductivity type are formed.

Concretely, a resist is applied to the entire surface of the substrate 101 and is processed by lithography to form a mask layer (not illustrated) covering the VNWs 101a in the active regions 100B, 100H. While using the mask layer (not illustrated), a P-type impurity is ion-implanted into the active regions 100A, 100C to 100G. As the P-type impurity, one type or a plurality of types selected from B, $BF_2$, In, and N are used. The ion implantation is preferably performed from a direction vertical to the surface of the substrate 101.

Then, the mask layer (not illustrated) is removed by ashing or wetting, and then the substrate 101 is heat-treated to activate the introduced P-type impurity. As above, the P-type well 107 is formed in the active regions 100A and 100C to 100G of the substrate 101.

Figure 26:
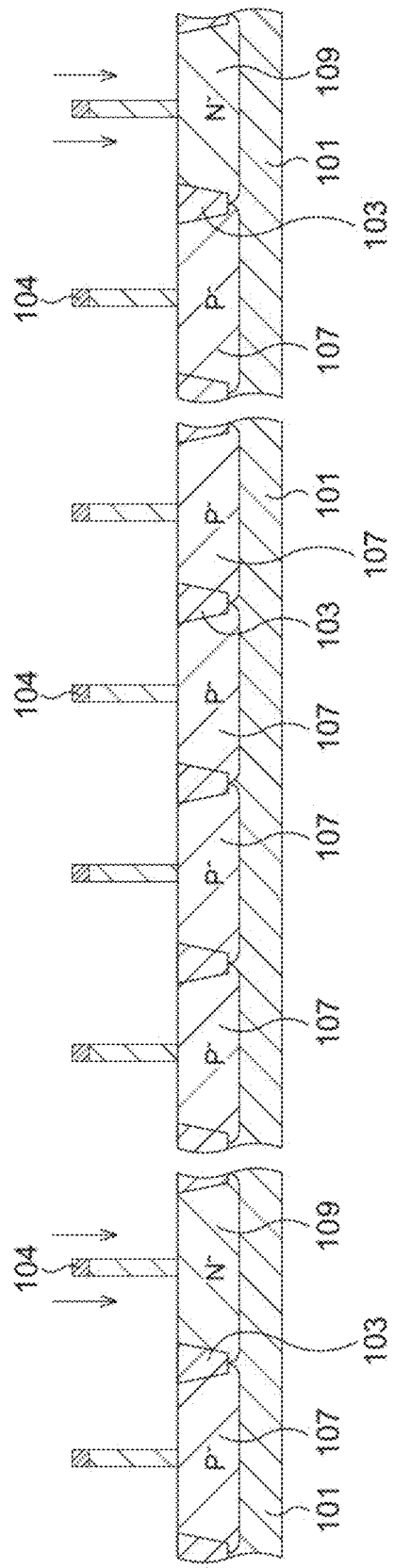
FIG. 26, which continues from FIG. 25, is a schematic cross-sectional view illustrating the manufacturing method of the semiconductor device according to the fifth embodiment, in order of processes.

Then, as illustrated in FIG. 26, N-type wells 109 are formed.

Concretely, a resist is applied to the entire surface of the substrate 101 and is processed by lithography to form a mask layer (not illustrated) covering the VNWs 101a in the active regions 100A, 100C to 100G. While using the mask layer (not illustrated), an N-type impurity is ion-implanted into the active regions 100B, 100H. As the N-type impurity, one type or a plurality of types selected from As, P, Sb, N are used. The ion implantation is preferably performed from a direction vertical to the surface of the substrate 101.

Then, the mask layer (not illustrated) is removed by ashing or wetting, and then the substrate 101 is heat-treated to activate the introduced N-type impurity. As above, the N-type well 109 is formed in the active regions 100B, 100H of the substrate 101.

Figure 27:
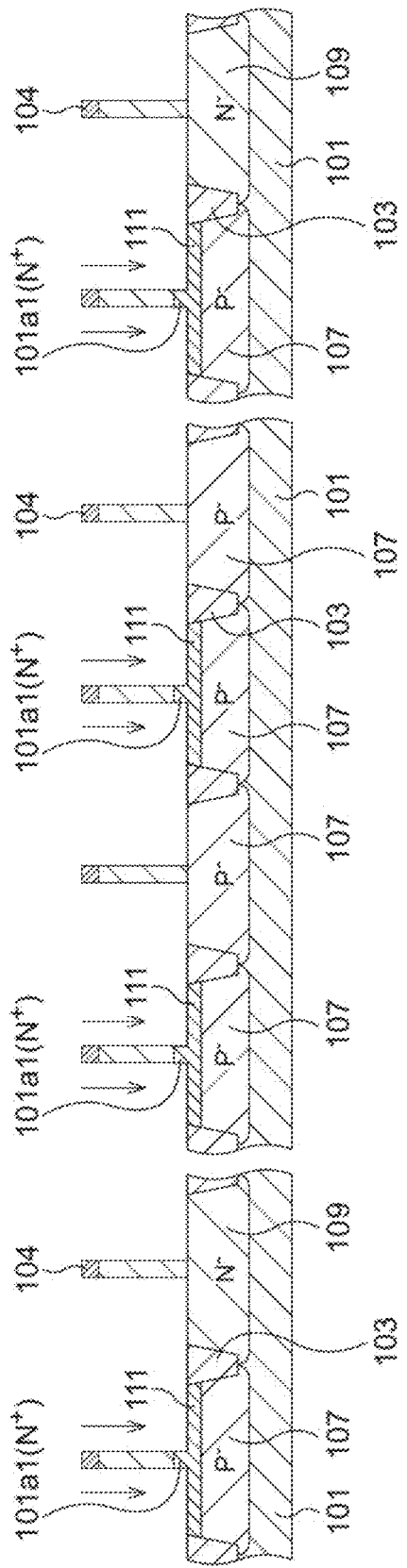
FIG. 27, which continues from FIG. 26, is a schematic cross-sectional view illustrating the manufacturing method of the semiconductor device according to the fifth embodiment, in order of processes.

Then, as illustrated in FIG. 27, N-type bottom regions 111 are formed.

Concretely, a resist is applied to the entire surface of the substrate 101 and is processed by lithography to form a mask layer (not illustrated) covering the VNWs 101a in the active regions 100B, 100D, 100F, and 100H. While using the mask layer (not illustrated), an N-type impurity is ion-implanted into surface layer portions of the wells 107 in the active regions 100A, 100C, 100E, and 100G. As the N-type impurity, one type or a plurality of types selected from As, P, Sb, N are used. The ion implantation is preferably performed from a direction vertical to the surface of the substrate 101.

Then, the mask layer (not illustrated) is removed by ashing or wetting, and then the substrate 101 is heat-treated to activate the introduced N-type impurity. As above, the N-type bottom region 111 is formed in the surface layer portions of the active regions 100A, 100C, 100E, and 100G and lower end portions 101a1 of the VNWs 101a. The bottom region 111 functions as a cathode region of the ESD protection diode in the diode formation region R2, and functions as a source region or a drain region of the transistor in the transistor formation region R1. Incidentally, the impurity concentration of the N-type bottom region 111 may be higher than that of the N-type well 109. Incidentally, the ion implantation for forming the N-type lower end portions 101a1 may be performed before the ion implantation for forming P-type lower end portions 101a1.

Figure 28:
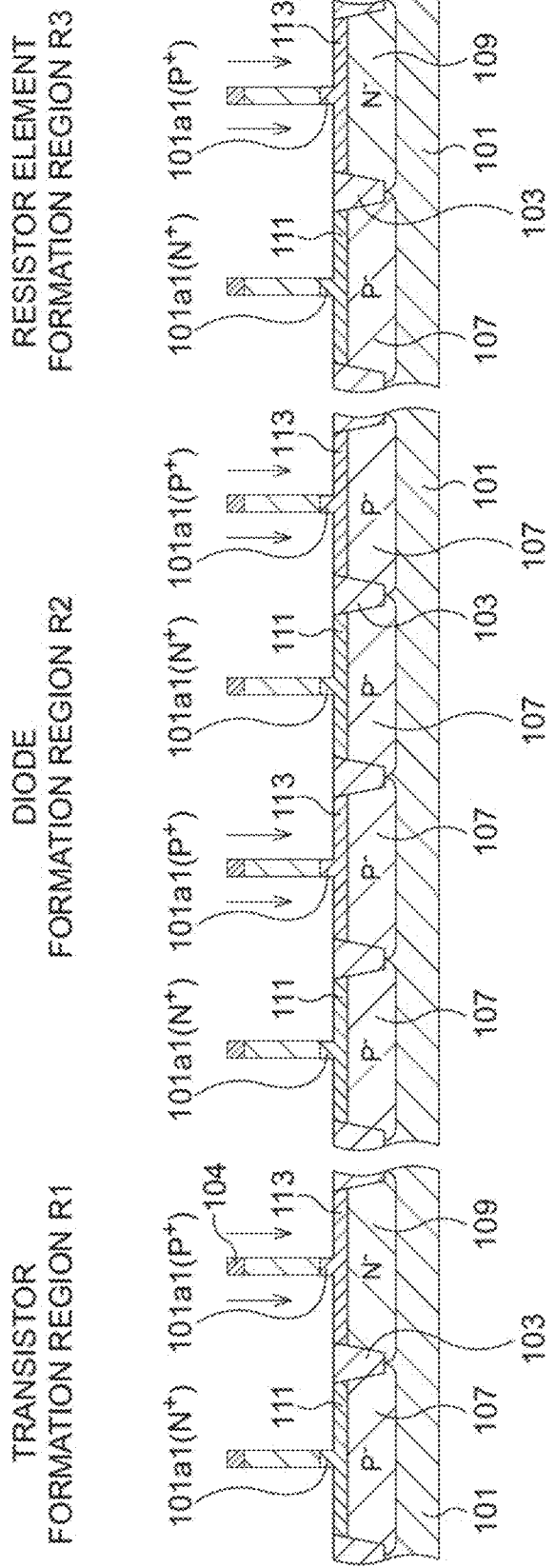
FIG. 28, which continues from FIG. 27, is a schematic cross-sectional view illustrating the manufacturing method of the semiconductor device according to the fifth embodiment, in order of processes.

Then, as illustrated in FIG. 28, P-type bottom regions 113 are formed.

Concretely, a resist is applied to the entire surface of the substrate 101 and is processed by lithography to form a mask layer (not illustrated) covering the VNWs 101a in the active regions 100A, 100C, 100E, and 100G. While using the mask layer (not illustrated), a P-type impurity is ion-implanted into surface layer portions of the wells 109 in the active regions 100B, 100D, 100F, and 100H. As the P-type impurity, one type or a plurality of types selected from B, $BF_2$, and In are used. The ion implantation is preferably performed from a direction vertical to the surface of the substrate 101.

Then, the mask layer (not illustrated) is removed by ashing or wetting, and then the substrate 101 is heat-treated to activate the introduced P-type impurity. As above, the P-type bottom region 113 is formed in the surface layer portions of the active regions 100B, 100D, 100F, and 100H and the lower end portions 101a1 of the VNWs 101a. The bottom region 113 functions as a cathode region of the ESD protection diode in the diode formation region R2, and functions as a source region or a drain region of the transistor in the transistor formation region R1. Incidentally, the impurity concentration of the P-type bottom region 113 may be higher than that of the P-type well 107. Incidentally, the ion implantation for forming the N-type lower end portions 101a1 may be performed before the ion implantation for forming the P-type lower end portions 101a1.

Figure 29:
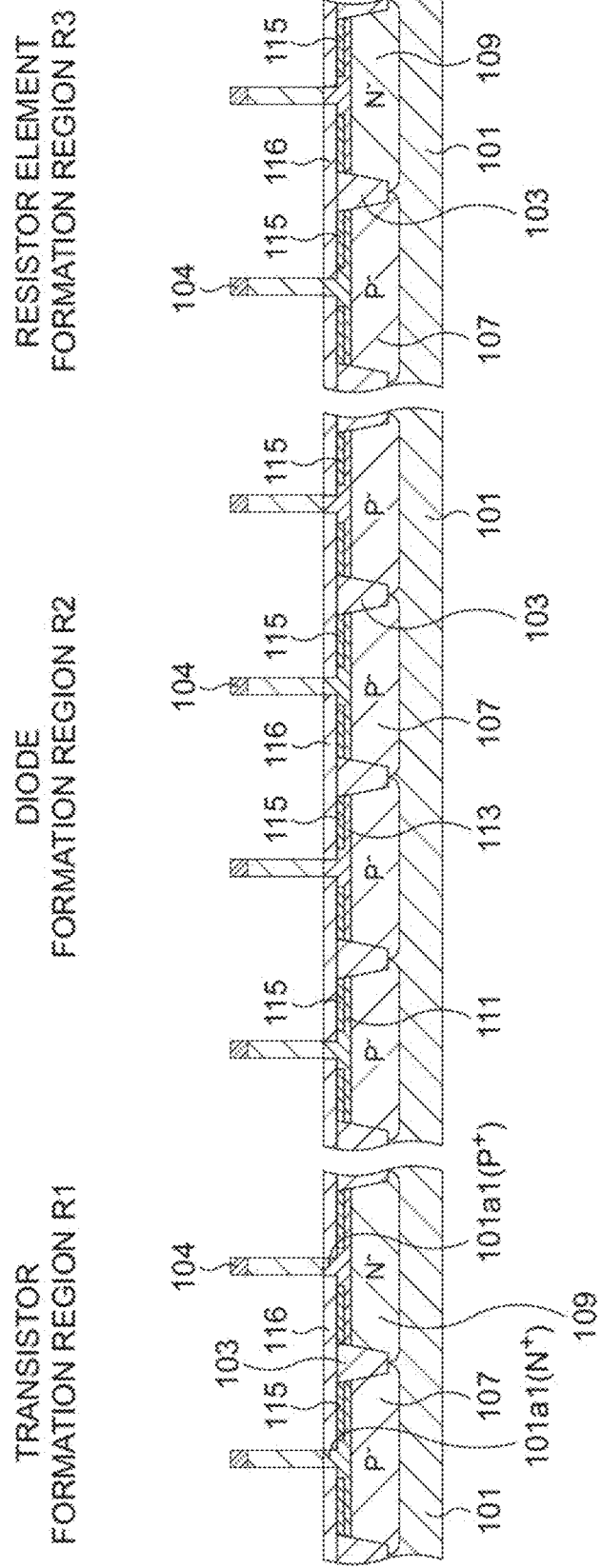
FIG. 29, which continues from FIG. 28, is a schematic cross-sectional view illustrating the manufacturing method of the semiconductor device according to the fifth embodiment, in order of processes.

Then, as illustrated in FIG. 29, a silicide layer 115 and an insulating film 116 are formed. The silicide layer 115 is formed by forming a metal film on the surfaces of the bottom regions 111 and the bottom regions 113 and performing a heat treatment thereon to silicide the surfaces of the bottom regions 111 and the bottom regions 113. As the material of the metal film, for example, Ni, Co, Mo, W, Pt, Ti, or the like is used. Incidentally, as illustrated in FIG. 29, the silicide layer 115 may be formed separately from the lower end portion 101a1 of the VNW 101a.

The insulating film 116 is formed by, for example, depositing an insulating material on the entire surface to cover the VNWs 101a, flattening the insulating material, and etching back the insulating material by a CVD method, and the like. As the material of the insulating film 116, for example, an insulating material of $SiO_2$, SiN, SiON, SiC, SiCN, SiOCN, or the like is used. The thickness of the insulating film 116 is, for example, about the height of an upper end of the lower end portion 101a1 of the VNW 101a from the top surface of the substrate 101. As above, the insulating film 116 is formed.

Figure 30:
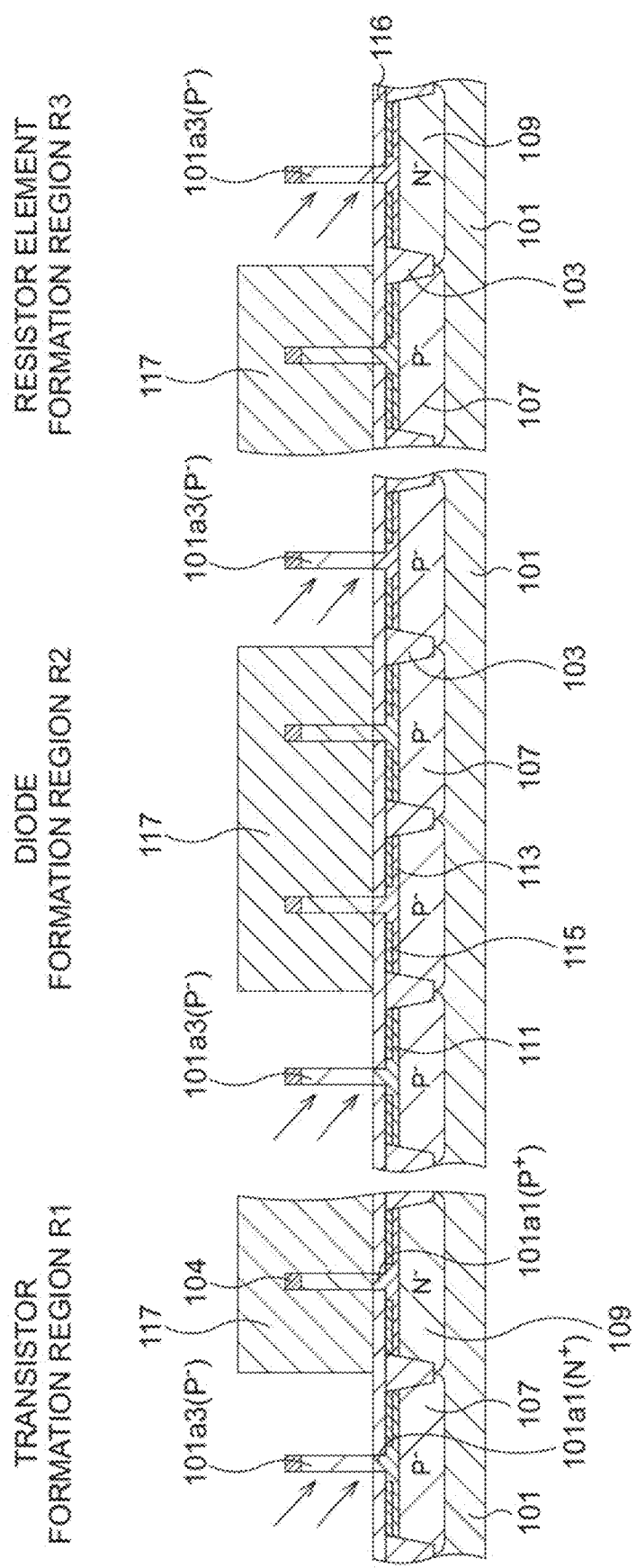
FIG. 30, which continues from FIG. 29, is a schematic cross-sectional view illustrating the manufacturing method of the semiconductor device according to the fifth embodiment, in order of processes.

Then, as illustrated in FIG. 30, an ion implantation of a P-type impurity is performed. Concretely, a resist is applied to the entire surface of the substrate 101 and is processed by lithography to form a mask layer 117 covering the active regions 100B, 100D, 100F, and 100G of the substrate 101. While using the mask layer 117, the P-type impurity is ion-implanted into the active regions 100A, 100C, 100F, and 100H that are exposed from the mask layer 117 at a relatively low concentration (lower than that of the P-type bottom region 113). As the P-type impurity, for example, one type or a plurality of types selected from B, $BF_2$, and In are used. The ion implantation is preferably performed from a direction inclined at a predetermined angle relative to the direction vertical to the surface of the substrate 101. Thereby, the P-type impurity is efficiently introduced into the VNWs 101a to make middle portions 101a3 of the VNWs 101a in 100A, 100C, 100F, and 100H into a P-type impurity region.

Then, the mask layer 117 is removed by ashing or wetting, and then the substrate 103 is heat-treated to activate the P-type impurity introduced into the middle portions 101a3 of the VNWs 101a in the active regions 100A, 100C, 100F, and 100H.

Figure 31:
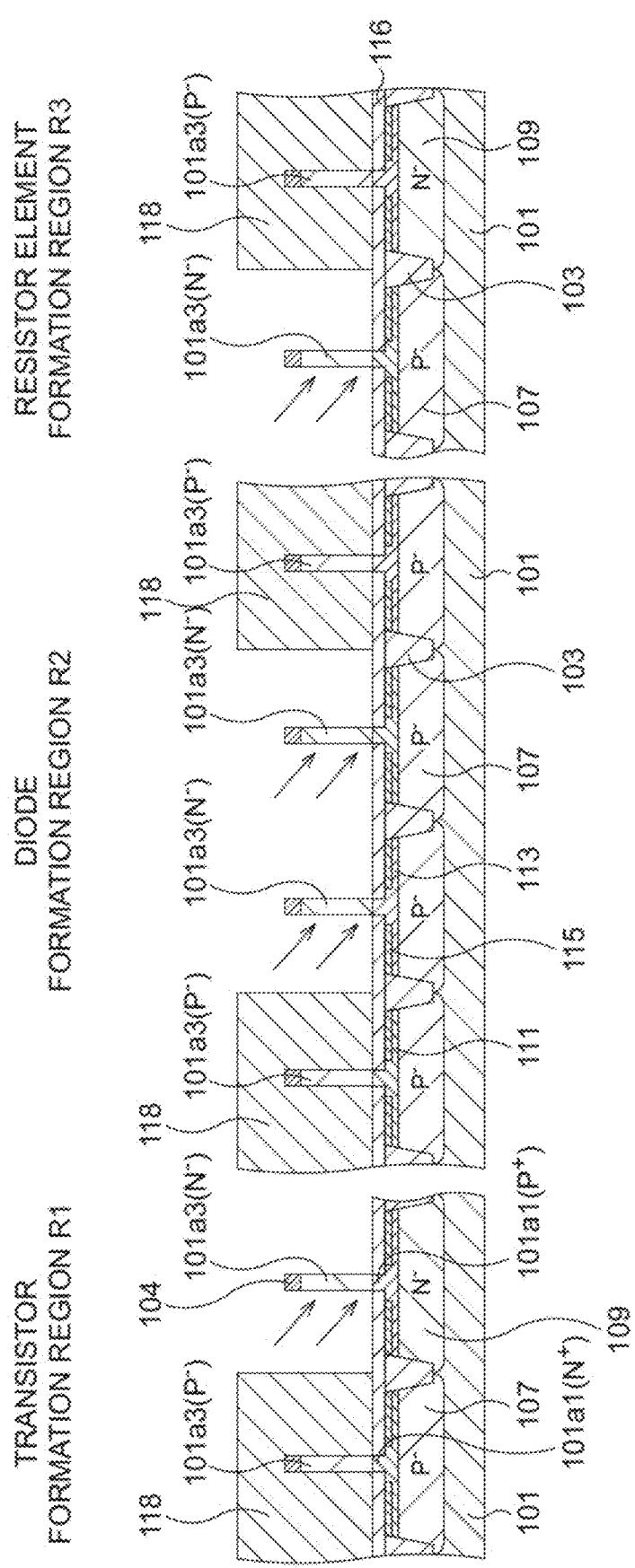
FIG. 31, which continues from FIG. 30, is a schematic cross-sectional view illustrating the manufacturing method of the semiconductor device according to the fifth embodiment, in order of processes.

Then, as illustrated in FIG. 31, an ion implantation of an N-type impurity is performed.

Concretely, a resist is applied to the entire surface of the substrate 101 and is processed by lithography to form a mask layer 118 covering the active regions 100A, 100C, 100F, and 100H of the substrate 101. While using the mask layer 118, the N-type impurity is ion-implanted into the active regions 100B, 100D, 100E, and 100G that are exposed from the mask layer 118 at a relatively low concentration (lower than that of the N-type bottom region 111). As the N-type impurity, for example, one type or a plurality of types selected from As, P, and Sb are used. The ion implantation is preferably performed from a direction inclined at a predetermined angle relative to the direction vertical to the surface of the substrate 101. Thereby, the N-type impurity is efficiently introduced into the VNWs 101a to make middle portions 101a3 of the VNWs 101a in 100B, 100D, 100E, and 100G into an N-type impurity region. Incidentally, the ion implantation for forming the N-type middle portion 101a3 may be performed before the ion implantation for forming the P-type middle portion 101a3.

Then, the mask layer 118 is removed by ashing or wetting, and then the substrate 101 is heat-treated to activate the N-type impurity introduced into the middle portions 101a3 of the VNWs 101a in the active regions 100B, 100D, 100E, and 100G.

Figure 32:
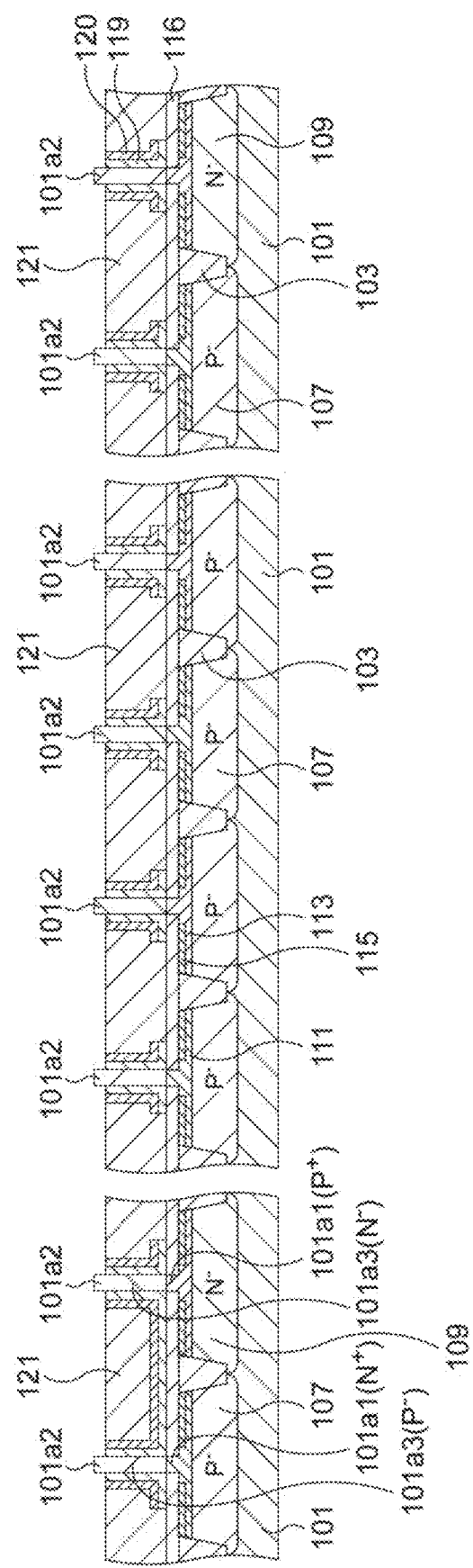
FIG. 32, which continues from FIG. 31, is a schematic cross-sectional view illustrating the manufacturing method of the semiconductor device according to the fifth embodiment, in order of processes.

Then, as illustrated in FIG. 32, a gate insulating film 119, a gate electrode 120, and an interlayer insulating film 121 are formed.

The gate insulating film 119, the gate electrode 120, and the interlayer insulating film 121 are formed as follows. First, a gate insulating material film and an electrode material film are formed on the entire surface in order so as to cover the VNWs 101a, and by patterning these films, the gate insulating film 119 and the gate electrode 120 are formed. In the transistor formation region R1, for example, the single gate insulating film 119 and the gate electrode 120 covering the two VNWs 101a in the active regions 100A and 100B are formed. However, the gate insulating film 119 and the gate electrode 120 may be formed separately to cover each of the VNWs 101a in the active regions 100A and 100B. In the diode formation region R2 and the resistor element formation region R3, for example, the gate insulating film 119 and the gate electrode 120 are formed in a divided manner to cover each of the VNWs 101a. However, in the diode formation region R2 and the resistor element formation region R3, a part or all of the gate insulating films 119 and the gate electrodes 120 formed on the respective VNWs 101a may be connected. An insulating film is deposited on the entire surface and is etched back to leave the insulating film to have a predetermined thickness smaller than that of the VNW 101a, and the interlayer insulating film 121 is formed. The portions of the gate insulating material film and the electrode material film projecting upward from the interlayer insulating film 121 are removed by etching back, and the gate insulating film 119 and the gate electrode 120 are formed on the side surfaces of the VNWs 101a. The hard mask 104 on the VNWs 101a is removed to expose upper end portions 101a2 of the VNWs 101a from the surface of the interlayer insulating film 121.

As the material of the gate insulating film 119, for example, an insulating material whose dielectric constant k is 7 or more, for example, SiN, $Ta_2O_5$, $Al_2O_3$, $HfO_2$, and so on are cited. As above, the gate insulating film 119 is formed.

Examples of the material of the gate electrode 120 include TiN, TaN, TiAl, TaAl, Ti-containing metal, Al-containing metal, W-containing metal, TiSi, NiSi, PtSi, polycrystalline silicon having silicide, and so on.

Examples of the material of the interlayer insulating film 121 include insulating materials of $SiO_2$, TEOS, PSG, BPSG, FSG, SiOC, SOG, SOP (Spin on Polymers), SiC, and so on.

Figure 33:
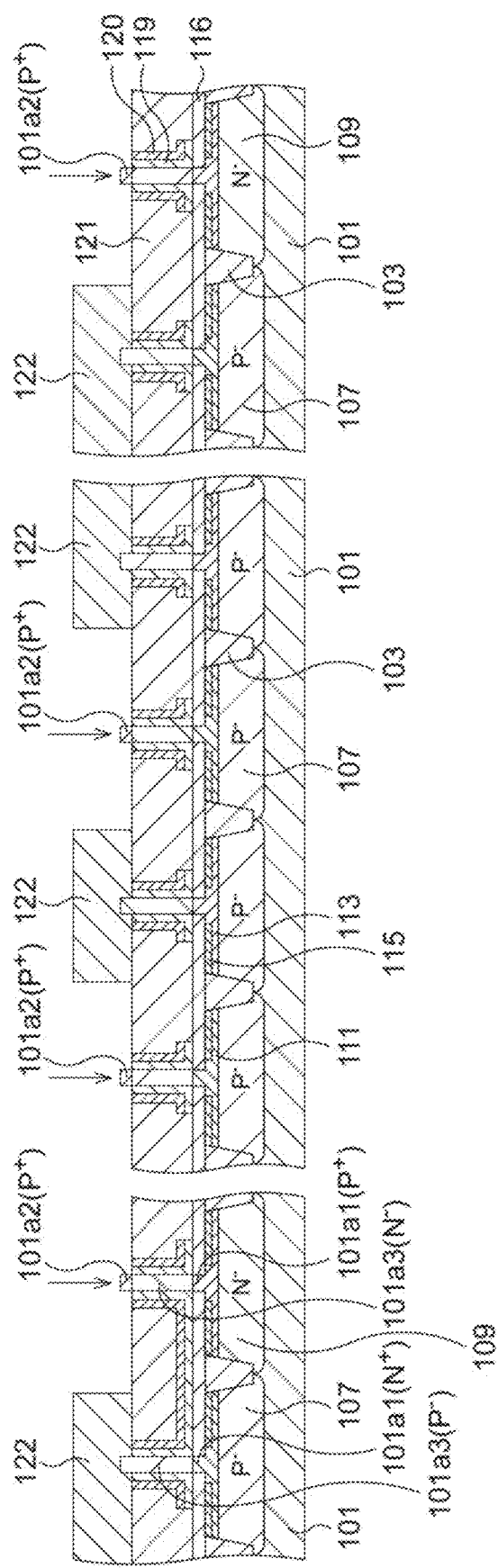
FIG. 33, which continues from FIG. 32, is a schematic cross-sectional view illustrating the manufacturing method of the semiconductor device according to the fifth embodiment, in order of processes.

Then, as illustrated in FIG. 33, an ion implantation of a P-type impurity is performed. Concretely, a resist is applied to the entire surface of the substrate 101 and is processed by lithography to form a mask layer 122 covering the active regions 100A, 100D, 100F, and 100G of the substrate 101. While using the mask layer 122, the P-type impurity is ion-implanted into the upper end portions 101a2 of the VNWs 101a exposed from the mask layer 122. As the P-type impurity, for example, one type or a plurality of types selected from B, $BF_2$, and in are used. The ion implantation is preferably performed from a direction inclined at a predetermined angle relative to the direction vertical to the surface of the substrate 101. Thereby, the P-type impurity is efficiently introduced into the upper end portions 101a2 of the VNWs 101a exposed from the surface of the interlayer insulating film 121. Incidentally, the impurity concentration of the P-type upper end portion 101a2 may be higher than that of the P-type middle portion 101a3 or the P-type well 107.

Then, the mask layer 121 is removed by ashing or wetting, and then the substrate 101 is heat-treated to activate the P-type impurity introduced into the upper end portions 101a2 in the active regions 100B, 100C, 100E, and 100H.

Figure 34:
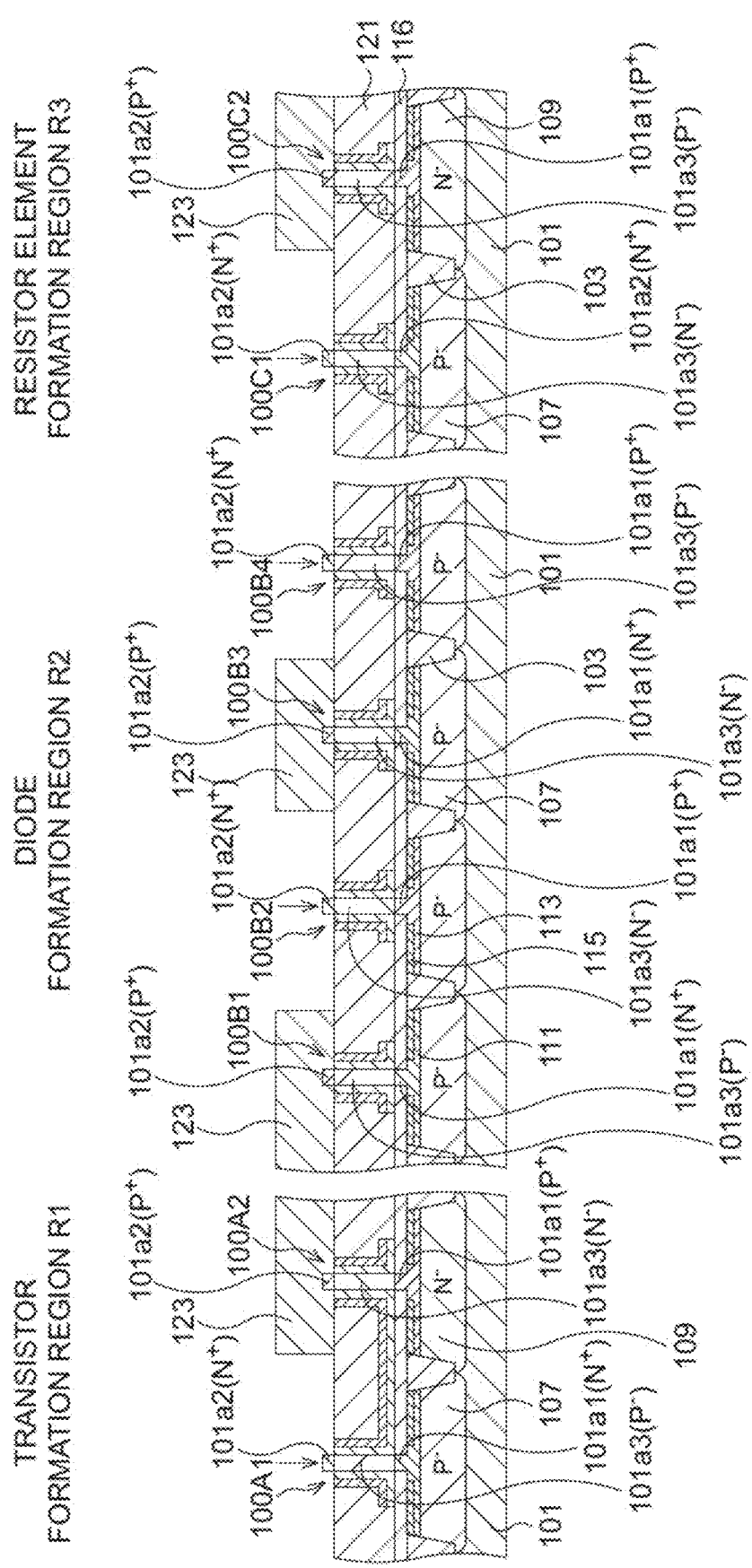
FIG. 34, which continues from FIG. 33, is a schematic cross-sectional view illustrating the manufacturing method of the semiconductor device according to the fifth embodiment, in order of processes.

Then, as illustrated in FIG. 34, an ion implantation of an N-type impurity is performed. Concretely, a resist is applied to the entire surface of the substrate 101 and is processed by lithography to form a mask layer 123 covering the active regions 100B, 100C, 100E, and 100i of the substrate 101. While using the mask layer 123, the N-type impurity is ion-implanted into the active regions 100A, 1000, 100F, and 100G that are exposed from the mask layer 123. As the N-type impurity, for example, one type or a plurality of types selected from As, P, and Sb are used. The ion implantation is preferably performed from a direction inclined at a predetermined angle relative to the direction vertical to the surface of the substrate 101. Thereby, the N-type impurity is efficiently introduced into the upper end portions 101a2 of the VNWs 101a exposed from the surface of the interlayer insulating film 121. Incidentally, the impurity concentration of the N-type upper end portion 102a2 may be higher than that of the N-type middle portion 102a3 or the N-type well 109. Further, the ion implantation for forming the N-type upper end portion 101a2 may be performed before the ion implantation for forming the P-type upper end portion 101a2.

Then, the mask layer 123 is removed by ashing or wetting, and then the substrate 101 is heat-treated to activate the N-type impurity introduced into the upper end portions 101a2 in the active regions 100A, 100D, 100F, and 100G.

Incidentally, in this embodiment, the case where the heat treatment for activating the P-type impurity and the N-type impurity that are introduced is performed for several times has been explained as an example, but this embodiment is not limited to this. For example, it is also possible that without performing the heat treatment for the impurity activation in FIG. 25, and so on, the ion implantation of the N-type impurity is performed in FIG. 34, and then a heat treatment is performed for one time to activate all the introduced P-type impurities and N-type impurities.

In FIG. 34, in the transistor formation region R1, two types of VNW transistors 100A1, 100A2 are formed, in the diode formation region R2, four types of VNW diodes 100B1 to 100B4, which are the ESD protection diode, are formed, and in the resistor element formation region R3, two types of VNW resistor elements 100C1, 100C2 are formed. In the diode formation region R2, a plurality of the VNW diodes 100B1 to a plurality of the VNW diodes 100B4 are each arranged in a row along the depth direction in FIG. 34.

In the transistor formation region R1, the VNW transistor 100A1 is an N-type transistor, and the lower end portion 101a1 and the upper end portion 101a2 are an N type and the middle portion 101a2 is a P type. The VNW transistor 100A2 is a P-type transistor, and the lower end portion 101a1 and the upper end portion 101a2 are a P type and the middle portion 101a2 is an N type. Incidentally, it is also possible that the ion implantation is not performed into the middle portions 101a2 of the VNW transistors 100A1 and 100A2 and they are non-doped.

In the diode formation region R2, of the VNW diode 100B1, the upper end portion 101a2 and the middle portion 101a3 are a P type and the lower end portion 101a1 is an N type, and a PN junction is formed. Of the VNW diode 100B1, the upper end portion 101a2 and the middle portion 101a3 are an anode and the lower end portion 101a1 is a cathode. Of the VNW diode 100B2, the lower end portion 101a1 is a P type and the upper end portion 101a2 and the middle portion 101a3 are an N type, and a PN junction is formed. Of the VNW diode 100B2, the lower end portion 101a1 is an anode and the upper end portion 101a2 and the middle portion 101a3 are a cathode. Of the VNW diode 100B3, the upper end portion 101a2 is a P type and the lower end portion 101a1 and the middle portion 101a3 are an N type, and a PN junction is formed. Of the VNW diode 100B3, the upper end portion 101a2 is an anode and the lower end portion 101a1 and the middle portion 101a3 are a cathode. Of the VNW diode 100B4, the lower end portion 101a1 and the middle portion 101a3 are a P type and the upper end portion 101a2 is an N type, and a PN junction is formed. Of the VNW diode 100B4, the lower end portion 101a1 and the middle portion 101a3 are an anode and the upper end portion 101a2 is a cathode.

In the resistor element formation region R3, the VNW resistor element 100C1 is an N-type resistor element, and the lower end portion 101a1, the upper end portion 101a2, and the middle portion 101a3 all are an N type. The VNW resistor element 100C2 is a P-type resistor element, and the lower end portion 101a1, the upper end portion 101a2, and the middle portion 101a3 all are a P type.

Figure 35:
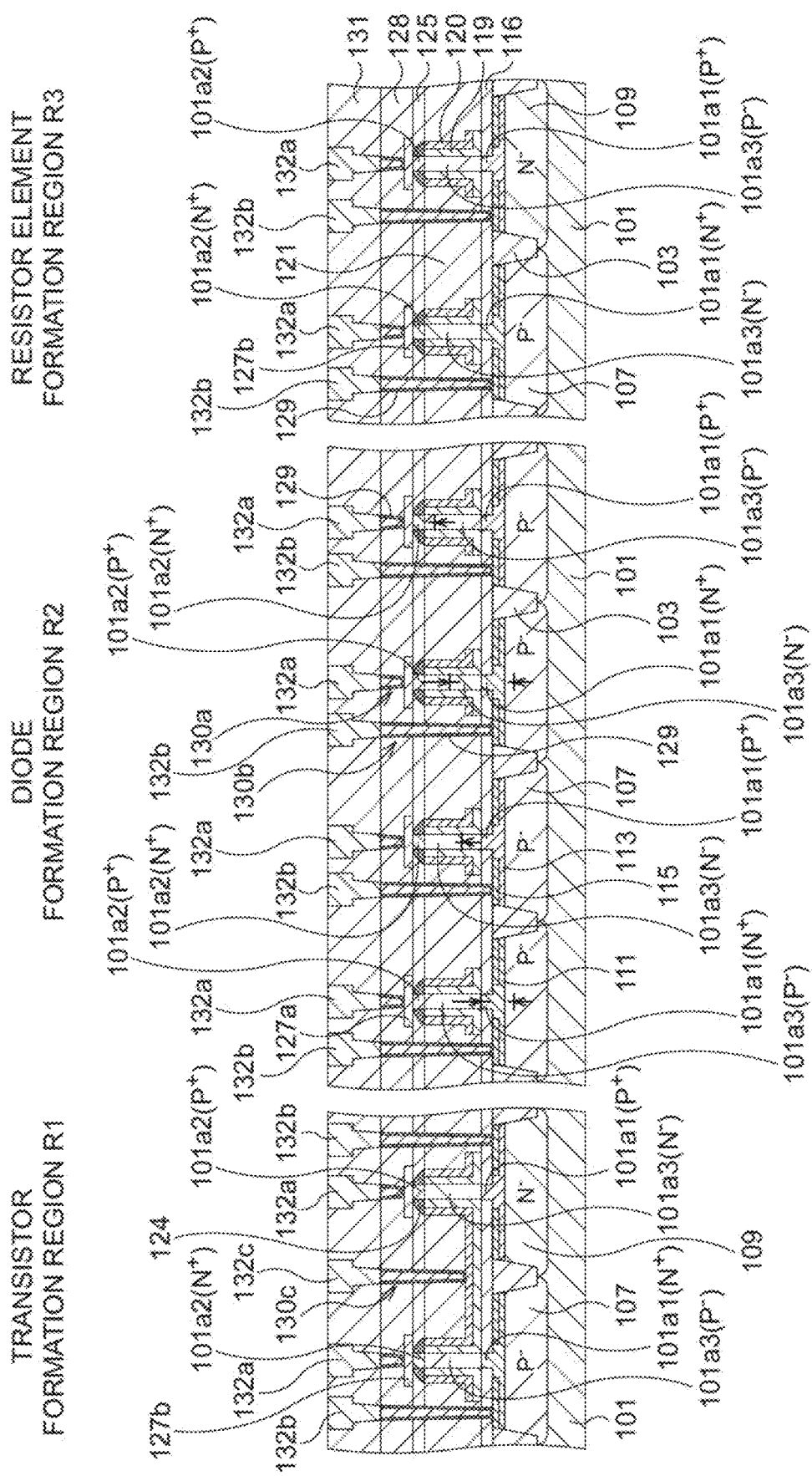
FIG. 35, which continues from FIG. 34, is a schematic cross-sectional view illustrating the manufacturing method of the semiconductor device according to the fifth embodiment, in order of processes.

Then, as illustrated in FIG. 35, the semiconductor device is formed.

A sidewall insulating film 124 is formed on side surfaces of the upper end portion 101a2 of each of the VNWs 101a. As the material of the sidewall insulating film 124, an insulating material of $SiO_2$, SiN, SiON, SiC, SiCN, SiOCN, or the like is used. An interlayer insulating film 125 is formed so that the upper end portion 101a2 and the sidewall insulating film 124 are embedded therein. As the material of the interlayer insulating film 125, an insulating material of $SiO_2$, TEOS, PSG, BPSG, FSG, SiOC, SOG, SOP (Spin on Polymers), SiC, or the like is used.

A top plate 127a is formed in a manner that, for example, a metal film is formed on a semiconductor layer to be silicided in the diode formation region R2. The top plate 127a is provided on the VNW diodes 100B1 to 100B4 in a VNW diode group 6 to be connected to the VNW diodes 100B1 to 100B4. A top plate 127h is formed in a manner that, for example, a metal film is formed on a semiconductor layer to be silicided in the transistor formation region R1 and the resistor element formation region R3. The top plate 127b is connected to each of the VNW transistors 100A1, 100A2 and each of the VNW resistor elements 1001C, 100C2. As the material of the semiconductor layer, for example, a semiconductor of polycrystalline silicon, amorphous silicon, or the like is used. As the material of the metal film, Ni, Co, Mo, W, Pt, Ti, or the like is used. Incidentally, in place of the silicided semiconductor layer, for example, as the metal film, a conductive film of a semiconductor or the like, into which a conductive nitride such as TiN or TaN, or the like and an impurity are introduced, may be firmed.

An interlayer insulating film 128 is formed to cover the top plates 127a, 127b. As the material of the interlayer insulating film 128, an insulating material of $SiO_2$, TEOS, PSG, BPSG, FSG, SiOC, SOG, SOP (Spin on Polymers), SiC, or the like is used.

A contact plug 130a is formed to be connected on the top plate 127a or 127b in the interlayer insulating film 128 in the transistor formation region R1, the diode formation region R2, and the resistor element formation region R3. A contact plug 130b is formed to be connected to the silicide layer 115 through the insulating film 116 and the interlayer insulating films 121, 125, and 128 in the transistor formation region R1, the diode formation region R2, and the resistor element formation region R3. A contact plug 130c is formed to be connected to the gate electrode 120 through the interlayer insulating films 121, 125, and 128 in the transistor formation region 41. The contact plugs 130a, 130b, and 130c contain a base film 129a formed to cover inner wall surfaces of openings and a conductive material 129b that fills the inside of each of the openings through the base film 129a. As the material of the base film 129a, for example, Ti, TiN, Ta, TaN, or the like is used. As the conductive material 129b, for example, Cu, a Cu alloy, W, Ag, Au, Ni, Al, Co, Ru, or the like is used. Incidentally, in the case where the conductive material 129b is Co or Ru, the formation of the base film 129a may be omitted.

An interlayer insulating film 131 is formed on the interlayer insulating film 128. As the material of the interlayer insulating film 131, an insulating material of SiO$_2$, TEOS, PSG, BPSG, FSG, SiOC, SOG, SOP (Spin on Polymers), SiC, or the like is used.

A wiring structure 132a is formed to be connected to the contact plug 130a in the interlayer insulating film 131 in the transistor formation region R1, the diode formation region R2, and the resistor element formation region R3. In the diode formation region R2, the wiring structure 132a is a pad wiring or a Vss power line and a wiring structure 132b is a Vdd power line or a pad wiring. The wiring structure 132b is formed to be connected to the contact plug 130b in the interlayer insulating film 131 in the transistor formation region R1, the diode formation region R2, and the resistor element formation region R3. A wiring structure 132c is formed to be connected to the contact plug 130c in the interlayer insulating film 131 in the transistor formation region R1. The wiring structures 132a, 132b, and 132c are formed in a manner that via holes and wiring grooves communicating in the interlayer insulating film 131 are formed by a dual damascene method and the via holes and the wiring grooves are filled with a conductive material by a plating method. As the conductive material, for example, Cu, a Cu alloy, Co, Ru, or the like is used.

As explained above, according to this embodiment, various steps such as the ion implantation step that are performed in the transistor formation region R1, the diode formation region R2, and the resistor element formation region R3 are shared, thereby making it possible to form the VNW transistors, the VNW diodes, and the VNW resistor elements without using dedicated steps in the respective regions R1 to R3.

Incidentally, in the fifth embodiment, the case where four types of the VNW diodes 100B1 to 100B4 are formed in the diode formation region R2 has been explained as an example, but only one type to three types of the VNW diodes 100B1 to 100B4 may be formed.

Further, as the well to be formed in the diode formation region R2 of the substrate 101, only the P-type well has been explained as an example, but in place of the P-type well, an N-type well may be formed, or a P-type well and an N-type well both may be formed.

Further, in the first to fourth embodiments, as the diode, one type or a plurality of types of the VNW diodes 100B1 to 100B4 may be used.

Further, in the first to fifth embodiments, as the diode, the ESD protection diode has been explained as an example, but a different type of diode other than the ESD protection diode may be used.

It should be noted that the first to fifth embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

According to the above-described aspect, there is fabricated a semiconductor device capable of, even when large current flows through an ESD protection diode, suppressing current concentration and suppressing damage of the ESD protection diode.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a semiconductor substrate;
   a plurality of first projections that are formed vertically to the semiconductor substrate on the semiconductor substrate and have a semiconductor material, each of the plurality of the first projections having a first lower end connected to the semiconductor substrate and a first upper end on the side opposite to the first lower end;
   a first diode group that has a plurality of diodes formed with the plurality of the first projections, each of the plurality of the diodes having a first conductivity type portion at the first lower end, and each of the plurality of the diodes having a second conductivity type portion that is different from the first conductivity type at the first upper end;
   a first conductive layer that is formed above the first diode group and is electrically connected to the first upper ends of the plurality of the first projections in common; and
   a plurality of first contact plugs that are formed above the first conductive layer and are electrically connected to the first conductive layer,
   wherein the first lower end of each of the plurality of first projections are electrically connected to each other, and the first upper end of each of the plurality of first projections are electrically connected to each other.

2. The semiconductor device according to claim 1, wherein
   one of the first contact plugs is provided at a position overlapping one of the first projections in a plane view.

3. The semiconductor device according to claim 1, wherein
   one of the first contact plugs is provided at a position displaced from one of the first projections in a plane view.

4. The semiconductor device according to claim 3, wherein the plurality of the first projections have two first projections that are arranged adjacently, and a distance in a plane view between one of the two first projections and one of the first contact plugs that is closest to the one of the two first projections is equal to a distance in a plane view between the other of the two first projections and closest of the plurality of the first contact plugs.

5. The semiconductor device according to claim 1, further comprising:

a plurality of second contact plugs that are formed on the semiconductor substrate and are electrically connected to the first lower ends of the plurality of the first projections in common, wherein in the first diode group, the plurality of the first projections are arranged in a matrix, the matrix has a first side extending in a first direction in a plane view and has a second side extending in a direction different from the first direction in the plane view, and the plurality of the second contact plugs are arranged along the first side and a side of the matrix, the side facing the first side, and the plurality of the second contact plugs are not arranged along the second side another side of the matrix facing the second side.

6. The semiconductor device according to claim 1, further comprising:

a plurality of second contact plugs that are formed on the semiconductor substrate and are electrically connected to the first lower ends of the plurality of the first projections in common, wherein in the first diode group, the plurality of the first projections are arranged in a matrix in a plane view, the matrix has a first side extending in a first direction in a plane view and has a second side extending in a direction different from the first direction in the plane view, a plurality of the second connection portions are arranged in a row along at least the first side and the second side, and in the first diode group, the first projection is not arranged at a corner of the matrix where at least the first side and the second side intersect.

7. The semiconductor device according to claim 1, further comprising:

a plurality of second contact plugs that are formed on the semiconductor substrate and are electrically connected to the first lower ends of the plurality of the first projections in common, wherein in the first diode group, the plurality of the first projections are arranged in a matrix in a plane view, the matrix has a first side extending in a first direction in a plane view and has a second side extending in a direction different from the first direction in the plane view, the plurality of the second contact plugs are arranged in a row along at least the first side and the second side, and one of the plurality of the second contact plugs arranged at the first side, which is closest to a second connection portion arranged at the second side, is arranged at a distance in the first direction from one of the plurality of first projections closest to the second connection portion arranged at the second side.

8. The semiconductor device according to claim 1, further comprising:

a plurality of second contact plugs that are formed on the semiconductor substrate and are electrically connected to the first lower ends of the plurality of the first projections in common;

a first wiring that is formed one of the plurality of first contact plugs, is electrically connected to the one of the plurality of first contact plugs, and extends in a first direction in a plane view; and a second wiring that is formed on one of the plurality of second contact plugs, is electrically connected to the one of the plurality of second contact plugs, and extends in the first direction in the plane view, wherein the plurality of the first projections are arranged along the first direction in the plane view, the plurality of the first contact plugs are arranged along the first direction in the plane view, and the plurality of the second contact plugs are arranged along the first direction in the plane view.

9. The semiconductor device according to claim 8, wherein one unit having the plurality of the first contact plugs, the plurality of the second contact plugs, the plurality of the first projections, the first wiring, and the second wiring, and a plurality of the one units are arranged in a row in a second direction different from the first direction in the plane view.

10. The semiconductor device according to claim 8, further comprising:

a plurality of second projections that are formed vertically to the semiconductor substrate on the semiconductor substrate and have a semiconductor material, each of the plurality of the second projections having a second lower end connected to the semiconductor substrate and a second upper end on the side opposite to the second lower end; and a second diode group that has a plurality of diodes formed with the plurality of second projections, each of the plurality of the diodes having the second conductivity type portion at the second lower end, and each of the plurality of the diodes having the first conductivity type portion at the second upper end, wherein the first upper end is electrically connected to the second upper end via the first wiring.

11. The semiconductor device according to claim 10, further comprising:

a power supply wiring and a grounding wiring, wherein the first lower end is electrically connected to the power supply wiring, and the second lower end is electrically connected to the grounding wiring.

12. The semiconductor device according to claim 11, wherein the power supply wiring and the grounding wiring extend in the second direction in the plane view on the first wiring and the second wiring.

13. The semiconductor device according to claim 10, further comprising:

a first impurity region that is formed in the semiconductor substrate and has the first conductivity type; and a second impurity region that is formed in the semiconductor substrate and has the second conductivity type, wherein the first diode group is positioned on the first impurity region, a second connection portion is connected to the first impurity region, the second diode group is positioned on the second impurity region, and a parasitic diode is formed on the semiconductor substrate between the first impurity region and the second impurity region.

14. The semiconductor device according to claim 13, further comprising:

a plurality of the first diode groups and a plurality of the second diode groups, wherein the first diode groups and the second diode groups are arranged in a matrix alternately in a plane view.

* * * * *